(12) United States Patent
Balicas et al.

(10) Patent No.: US 9,455,365 B1
(45) Date of Patent: Sep. 27, 2016

(54) OPTOELECTRONIC SWITCH HAVING A PHOTOVOLTAIC RESPONSE AND ASSOCIATED METHOD OF USE

(71) Applicant: The Florida State University Research Foundation, Inc., Tallahassee, FL (US)

(72) Inventors: Luis Balicas, Tallahassee, FL (US); Nihar R. Pradhan, Tallahassee, FL (US); Efstratios Manousakis, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 15/054,829

(22) Filed: Feb. 26, 2016

Related U.S. Application Data

(60) Provisional application No. 62/128,361, filed on Mar. 4, 2015.

(51) Int. Cl.
   *H01L 31/00* (2006.01)
   *H01L 31/078* (2012.01)
   *H01L 31/0224* (2006.01)
   *H01L 31/032* (2006.01)

(52) U.S. Cl.
   CPC ..... *H01L 31/078* (2013.01); *H01L 31/022425* (2013.01); *H01L 31/032* (2013.01)

(58) Field of Classification Search
   CPC .................... H01L 31/078; H01L 31/022425; H01L 31/032

USPC ......................................................... 257/449
See application file for complete search history.

(56) References Cited

U.S. PATENT DOCUMENTS 9,349,802 B2 * 5/2016 Heo .................... H01L 29/7606

OTHER PUBLICATIONS

Pradhan et al., An Optoelectronic Switch Based on Intrinsic Dual Schottky Diodes in Ambipolar MoSe2 Field-Effect Transistors. Adv. Electron. Mater. 2015. vol 1, 1500215: 1-9.
Pradhan et al., Supporting Information for An Optoelectronic Switch Based on Intrinsic Dual Schottky Diodes in Ambipolar MoSe2 Field-Effect Transistors. Adv. Electron. Mater. 2015. Weinheim, Germany. 1-11.
Memaran et al., Pronounced Photovoltaic Response from Multilayered Transition-Metal Dichalcogenides PN-Junctions. Nano Lett. 2015. vol. 15: 7532-7538.

* cited by examiner

*Primary Examiner* — Tu-Tu Ho
(74) *Attorney, Agent, or Firm* — Molly L. Sauter; Smith & Hopen, P.A.

(57) ABSTRACT

A light-induced diode-like response in multi-layered MoSe$_2$ field-effect transistors resulting from a difference in the size of the Schottky barriers between drain and source contacts, wherein each barrier can be modeled as a Schottky diode but with opposite senses of current rectification, wherein the diode response results from the light induced promotion of photo-generated carriers across the smaller barrier. The sense of current rectification can be controlled by the gate voltage which is able to modulate the relative amplitude between both barriers, yielding a photovoltaic response.

20 Claims, 26 Drawing Sheets

FIG. 13A

| $v_{bg}$ (V) | $P$ (μW) | $N_S$ | $n_d$ | $R_S$ (MΩ) | $I_L^{(s)}$ (μA) | $I_L^{(d)}$ (μA) | $I_D^{(s)}$ (μA) | $I_D^{(d)}$ (μA) |
|---|---|---|---|---|---|---|---|---|
| 0 | 0 | 1.3 | 1.1 | 0.02 | 0 | 0 | 0.012 | 0.0004 |
| 0 | 15.7 | 1.3 | 1.1 | 0.02 | 0.14 | 0.0 | 0.012 | 0.0004 |
| 0 | 30 | 1.3 | 1.1 | 0.02 | 0.28 | 0.0004 | 0.012 | 0.0004 |
| -7.5 | 0 | 1.744 | 1.1628 | 0.2 | 0 | 0 | 0.08 | 0.006 |
| -7.5 | 15.7 | 1.744 | 1.1628 | 0.2 | 0.1 | 0.88 | 0.08 | 0.006 |
| -7.5 | 30 | 1.744 | 1.1628 | 0.2 | 0.15 | 1.55 | 0.08 | 0.006 |

FIG. 13B

| $v_{bg}$ (V) | $P$ (μW) | $N_S$ | $n_d$ | $R_S$ (MΩ) | $I_L^{(s)}$ (μA) | $I_L^{(d)}$ (μA) | $I_L^{(s)}$ (μA) | $I_L^{(d)}$ (μA) |
|---|---|---|---|---|---|---|---|---|
| 0 | 0 | 1.1357 | 1.1628 | 1.2 | 0 | 0 | 0.00002 | 0.00001 |
| 0 | 15.7 | 1.1357 | 1.1628 | 1.2 | 0.45 | 0.16 | 0.00002 | 0.00001 |
| 0 | 30 | 1.20155 | 1.1628 | 0.5 | 0.48 | 0.32 | 0.00002 | 0.00001 |
| -7.5 | 0 | 1.2 | 1.0 | 0.02 | 0 | 0 | 0.01 | 0.001 |
| -7.5 | 15.7 | 1.2 | 1.0 | 0.02 | 0.55 | 0.01 | 0.01 | 0.001 |
| -7.5 | 30 | 1.2 | 1.0 | 0.02 | 1.2 | 0.04 | 0.01 | 0.001 |

OPTOELECTRONIC SWITCH HAVING A PHOTOVOLTAIC RESPONSE AND ASSOCIATED METHOD OF USE

CROSS-REFERENCE TO RELATED APPLICATION

This application claims priority to U.S. Provisional Patent Application No. 62/128,361, filed on Mar. 4, 2015 and entitled, "Optoelectronic Switch Having A Photovoltaic Response", which is herein incorporated by reference in its entirety.

GOVERNMENT SUPPORT

This invention was made with government support under W911NF-11-1-0362 awarded by the U.S. Army Research Office. The government has certain rights in the invention.

FIELD OF INVENTION

This invention relates to optoelectronic switches, and more particularly, to an optical field-effect transistor (FET) switch having a photovoltaic response.

BACKGROUND OF THE INVENTION

Transition metal dichalcogenides (TMDs) are claimed to absorb between 5% and 10% of the incident sunlight when exfoliated into thicknesses inferior to 1 nm displaying one order of magnitude higher sunlight absorption than most of the commonly used solar absorbers. In monolayers this leads to the observation of unique optical and optoelectronic properties. Pronounced photoconducting and photovoltaic responses are also observed in heterostructures incorporating graphene and multilayered TMDs.

The high light absorption in TMDs is attributed to the existence of pronounced van Hove singularities in the electronic density of states leading to a pronounced joint density of states in the visible light region and hence ensuring relatively strong light-matter interactions. Strong light matter interactions led to reports of incredibly high photoresponsivities in single-layer $MoS_2$, i.e., approaching $\sim 10^3$ A $W^{-1}$ in the limit of very low illumination power densities. For a large area, chemical vapor deposited heterostructures of graphene onto $MoS_2$ monolayers photoresponsivities as high as $10^7$ A $W^{-1}$ have been reported under illumination power densities p approaching just $\sim 10^{-3}$ $Wm^{-2}$. Very high photoresponsivities and concomitantly high external quantum efficiencies have also been observed for graphene and transition metal dichalcogenides (TMD) based heterostructures, even when transferred on to flexible substrates.

Various methods are known in the art for harvesting a photovoltaic response from these thin layers of transition metal dichalcogenides, including the formation of p-n junctions, and vertical heterostructures. While many of these approaches have led to sizeable short-circuit currents or currents in the absence of a bias voltage resulting from the photovoltaic effect, the conversion efficiencies of these TMD based devices are still unacceptable for technological applications.

Accordingly, what is needed in the art is a transition metal dichalcogenides (TMD) based device that exhibits a higher extracted photovoltaic power conversion efficiency than TMD-based devices currently known in the art.

SUMMARY OF INVENTION

The present invention describes a light-induced diode-like response in multi-layered $MoSe_2$ field-effect transistors resulting from a difference in the size of the Schottky barriers between drain and source contacts, wherein each barrier can be modeled as a Schottky diode but with opposite senses of current rectification, wherein the diode response results from the light induced promotion of photo-generated carriers across the smaller barrier. The sense of current rectification can be controlled by the gate voltage which is able to modulate the relative amplitude between both barriers yielding a photovoltaic response.

In one embodiment, the present invention provides an optical FET (field-effect transistor) switch comprising, a semiconductor substrate, a dielectric layer positioned over the semiconductor substrate, a transition metal dichalcogenides (TMD) layer positioned over the dielectric layer, a first contact and a second contact positioned on the TMD layer, a first Schottky diode formed at an interface between the first contact and the TMD layer and a second Schottky diode formed at an interface between the second contact and the TMD layer, wherein a barrier height of the first Schottky diode and a barrier height of the second Schottky diode are asymmetrical and wherein a sense of current rectification of the first Schottky diode is opposite a sense of current rectification of the second Schottky diode.

In a specific embodiment, the semiconductor substrate of the inventive optical FET switch is a p-doped silicon (Si) wafer, the dielectric layer is a silicon dioxide ($SiO_2$) layer and the TMD layer is a molybdenum ($MoSe_2$) layer comprising multi-layered flakes of $MoSe_2$. In an additional embodiment, the semiconductor substrate of the inventive optical FET switch is an undoped silicon (Si) wafer with a back gate of gold pattern evaporated onto the substrate and the dielectric layer is a boron nitride. These exemplary embodiments are not intended to be limiting, and various other combinations of substrates, dielectric layers and TMD layers are considered within the scope of the present invention.

In various embodiments, the first contact comprises at least one metal having a first work function and the second contact comprises at least one metal having a second work function. In a specific embodiment, the first contact and the second contact comprise a layer of gold (Au) and a layer of titanium (Ti).

The optical FET of the present invention may further comprise a gate voltage coupled to the semiconductor substrate, the gate voltage to control the sense of current direction in the first Schottky diode and the sense of current direction in the second Schottky diode by controlling a relative barrier height between the barrier height of the first Schottky diode and the barrier height of the second Schottky diode. The gate voltage may be a back gate voltage or a top gate voltage, in accordance with a specific geometry of the optical FET.

In an additional embodiment, a method for generating a photovoltaic response in a multi-layered transition metal dichalcogenides (TMD) field-effect transistor (FET) is provided, which includes, establishing a first Schottky diode at an interface between a first contact and a transition metal dichalcogenides (TMD) layer of a transition metal dichalcogenides (TMD) field-effect transistor (FET), establishing a second Schottky diode at an interface between a second contact and the TMD layer of the transition metal dichalcogenides (TMD) field-effect transistor (FET), wherein a barrier height of the first Schottky diode and a barrier height of the second Schottky diode are asymmetrical and wherein a sense of current rectification of the first Schottky diode is opposite a sense of current rectification of the second Schottky diode and subjecting the transition metal dichalcogenides (TMD) layer of the TMD field-effect transistor (FET) to illumination to generate a diode like response with concomitant photovoltaic effect in the TMD field-effect transistor (FET). The method may further include applying a gate voltage at a semiconductor substrate of the TMD field-effect transistor (FET) to control the barrier height of the first Schottky diode relative to the barrier height of the second Schottky diode, thereby controlling the sense of current rectification of the first Schottky diode and the second Schottky diode.

Accordingly, the present invention provides a transition metal dichalcogenides (TMD) based device that also exhibits a photovoltaic response.

BRIEF DESCRIPTION OF THE DRAWINGS

For a fuller understanding of the invention, reference should be made to the following detailed description, taken in connection with the accompanying drawings, in which.

Figure 8A:
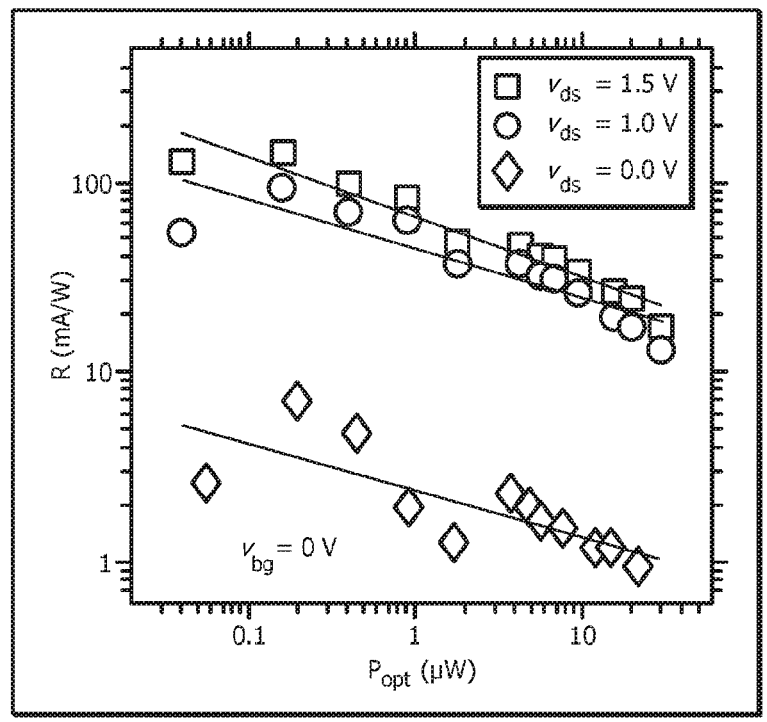
FIG. 8A is a graphical illustration of the photo responsivity $R=I_{ph}/P_{opt}$ as a function of $P_{opt}$ and for 3 values of the bias voltage, 0.0V, 1.0V and 1.5V, in accordance with a first exemplary FET embodiment of the present invention. The solid lines represent linear fits yielding nearly the same power law dependence $R \propto P^{\gamma}_{opt}$ with $\gamma \cong -0.3$.
Figure 8B:
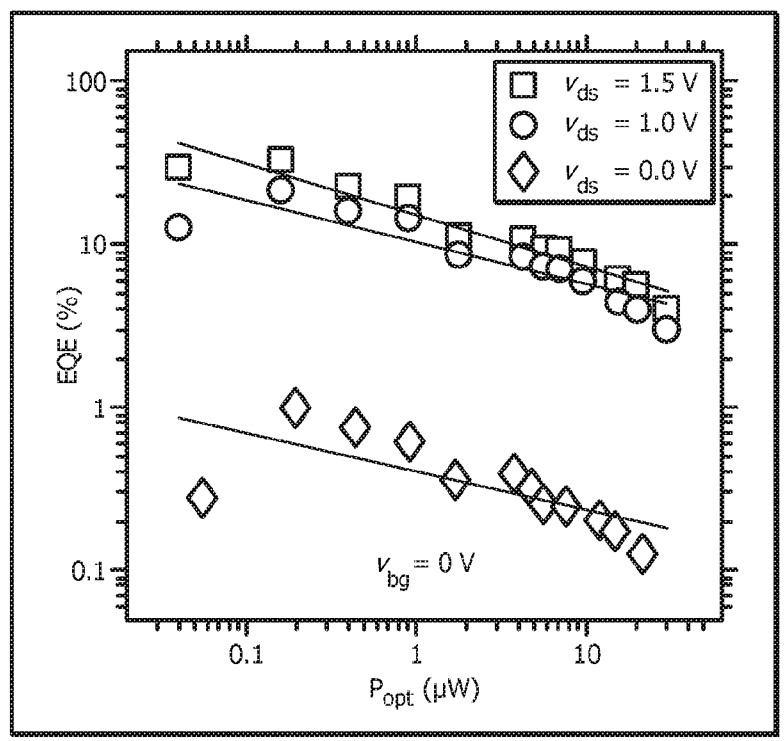
FIG. 8B is a graphical illustration of EQE as extracted from the data in FIG. 8A, yielding the same power dependence.
Figure 8C:
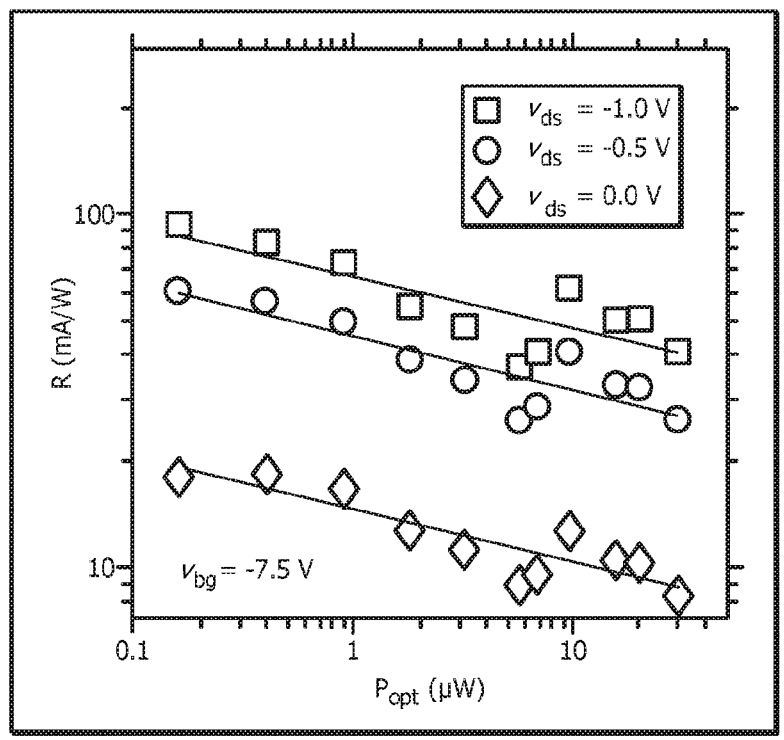
FIG. 8C is a graphical illustration of the photo-responsivity as a function of $P_{opt}$ under $V_{bg}$=−7.5 V and for 3 values of the bias voltage, 0.0V, 0.5V and −1.0 V. Red lines are linear fits yielding γ≅−0.15.
Figure 8D:
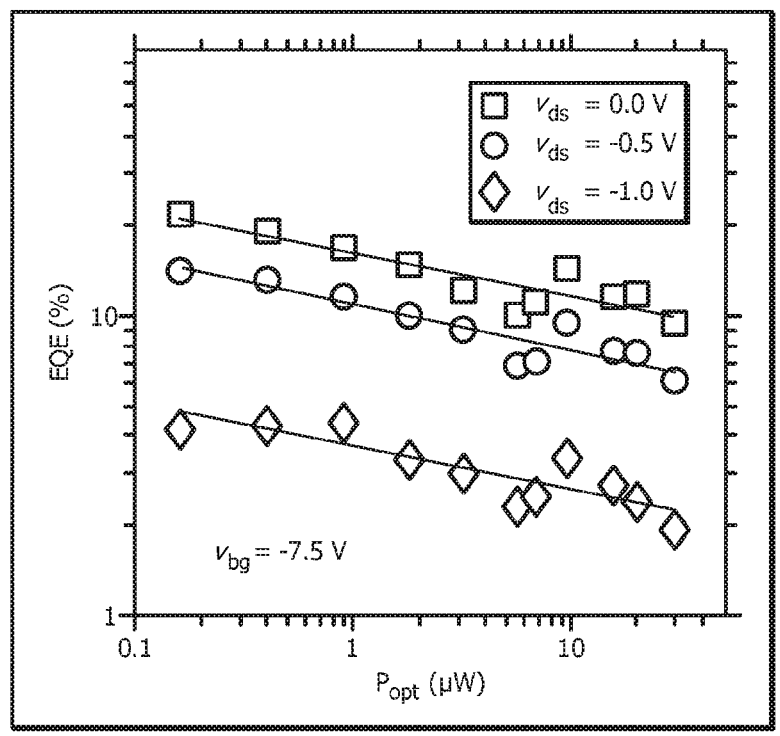

FIG. 8D is a graphical illustration of EQE from the data FIG. 8C.

Figure 9A:
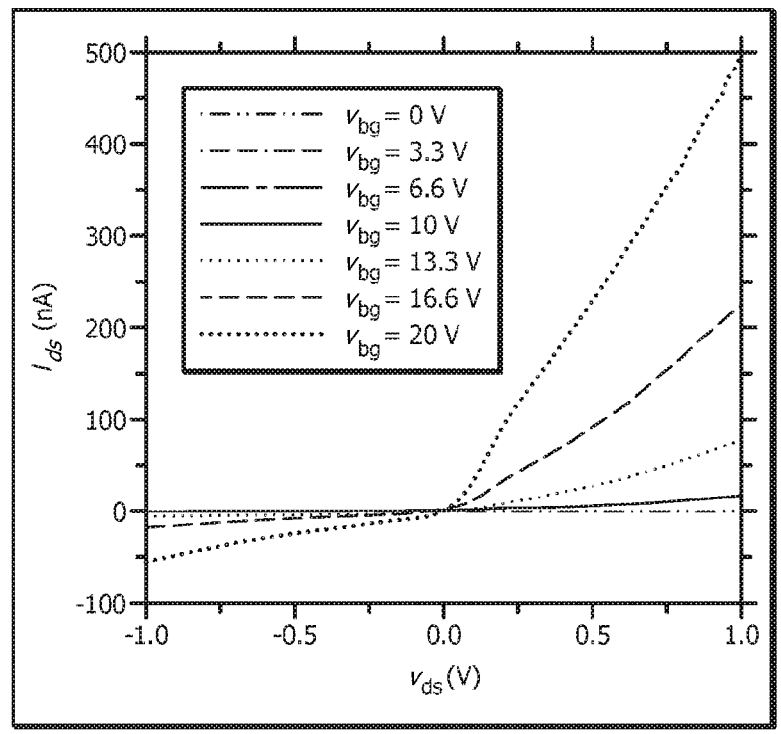

FIG. 9A is a graphical illustration of the drain to source current $I_{ds}$ as a function of $V_{ds}$ for a second exemplary FET and for several values of back gate voltage $V_{bg}$.

Figure 9B:
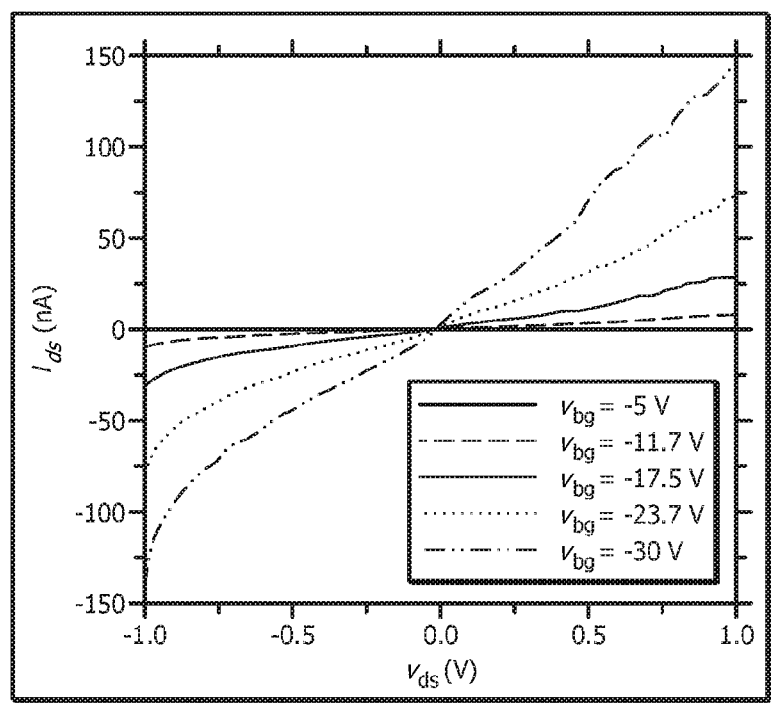

FIG. 9B is a graphical illustration of the drain to source current $I_{ds}$ as a function of $V_{ds}$ for a second exemplary FET and for several values of back gate voltage $V_{bg}$.

Figure 10A:
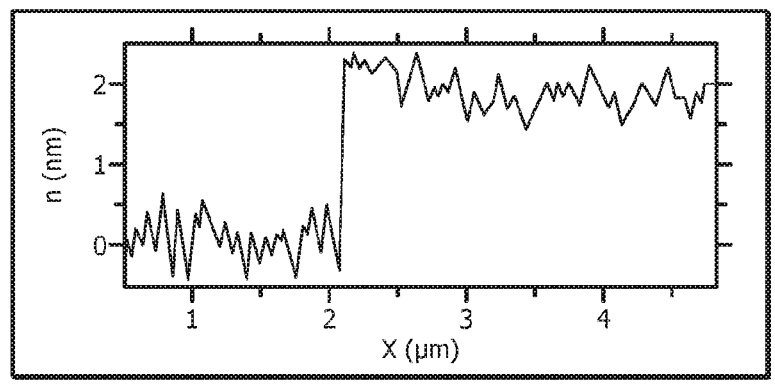

FIG. 10A is an atomic force microscopy height profile of a third exemplary FET in accordance with the present invention, indicating a thickness of approximately 2 nm or 3 atomic layers.

Figure 10B:
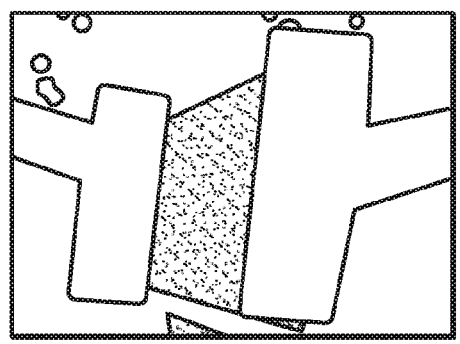

FIG. 10B is a sketch of a micrograph of the third exemplary FET in accordance with the present invention.

Figure 10C:
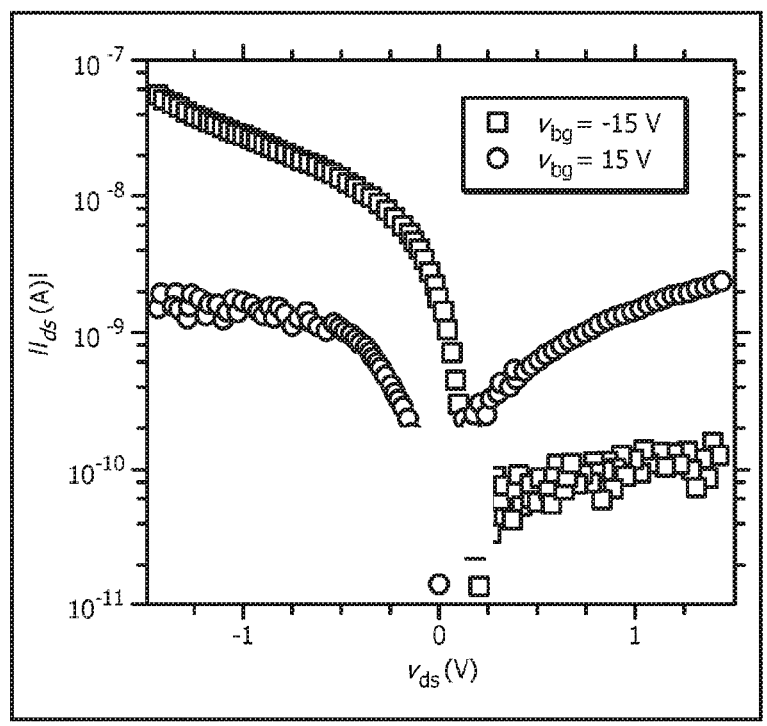

FIG. 10C is a graphical illustration of the drain to source current $I_{ds}$ as a function of $V_{ds}$ for a third exemplary FET and for two values of back gate voltage $V_{bg}$, +15V and −15V.

Figure 10D:
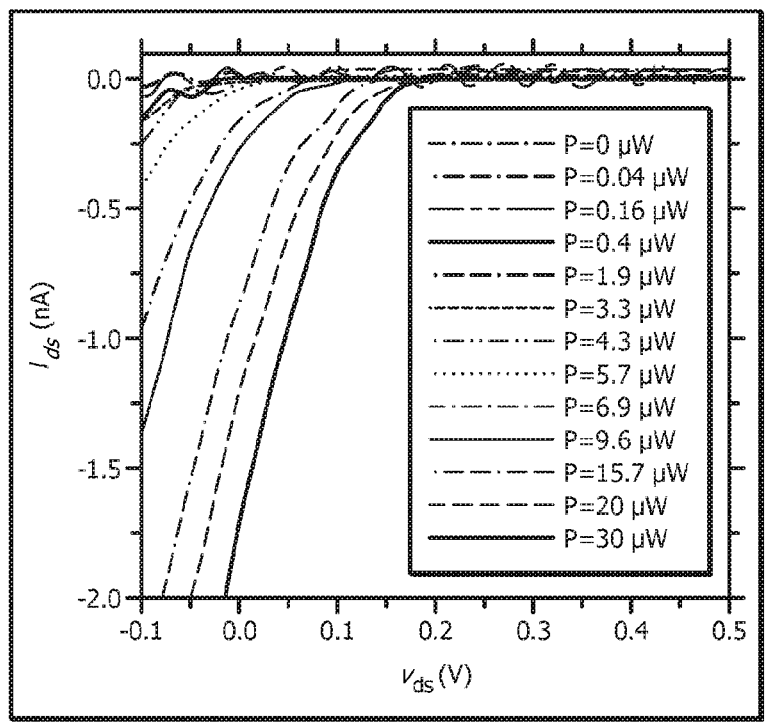

FIG. 10D is a graphical illustration of $I_{ds}$ as a function of $V_{ds}$ for several values of illumination power P, in accordance with a third exemplary FET.

Figure 10E:
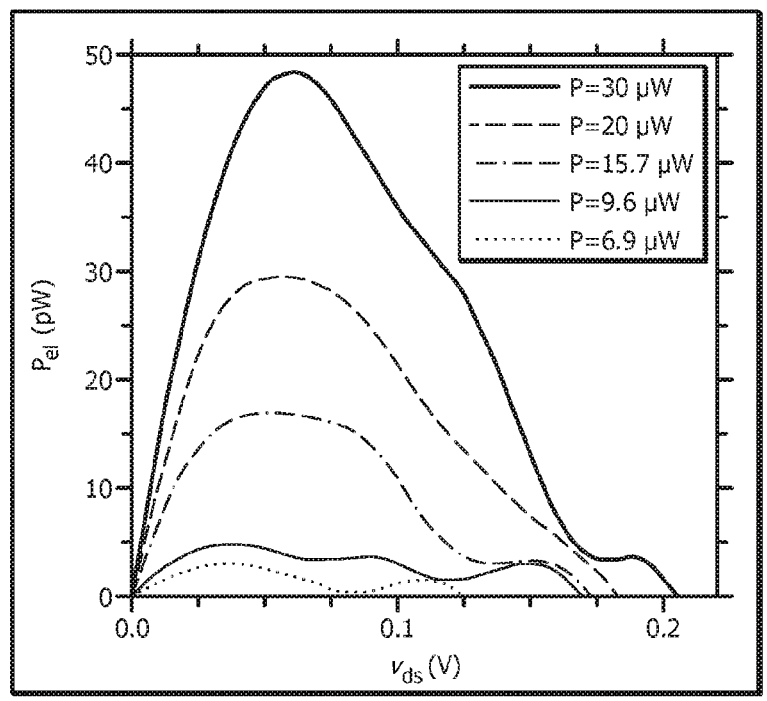

FIG. 10E is a graphical illustration of the photogenerated electrical power $P_{el}=I_{ds} \times V_{ds}$ as a function of $V_{ds}$ for several values of the illumination power, in accordance with a third exemplary FET.

Figure 11A:
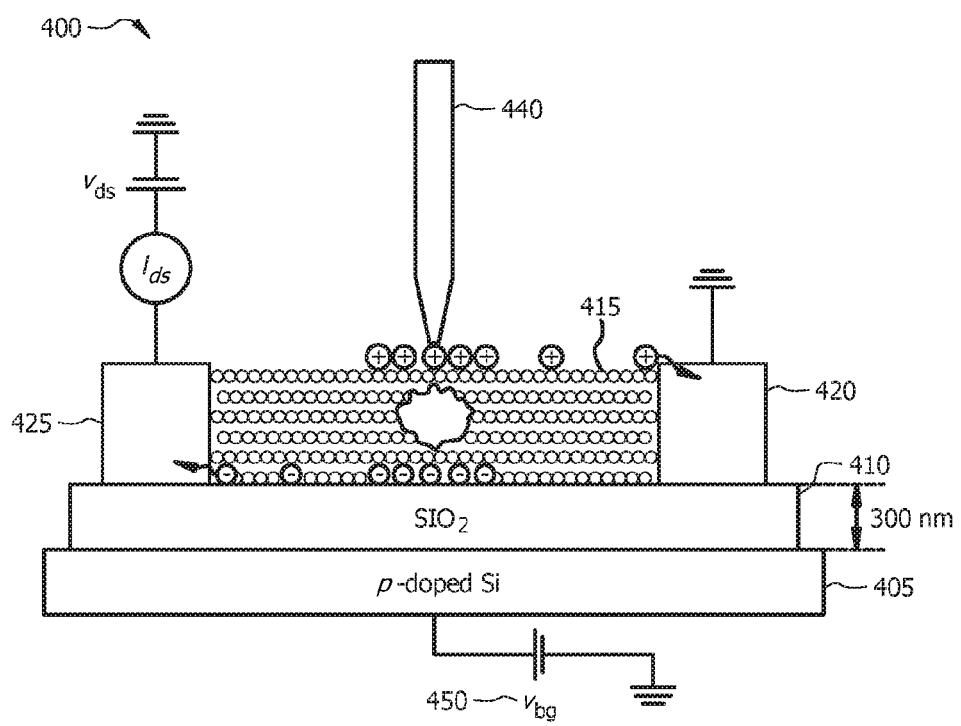

FIG. 11A is a sketch of one exemplary $MoSe_2$ field-effect transistor under illumination and under applied gate and excitation voltages, in accordance with an embodiment of the present invention.

Figure 11B:
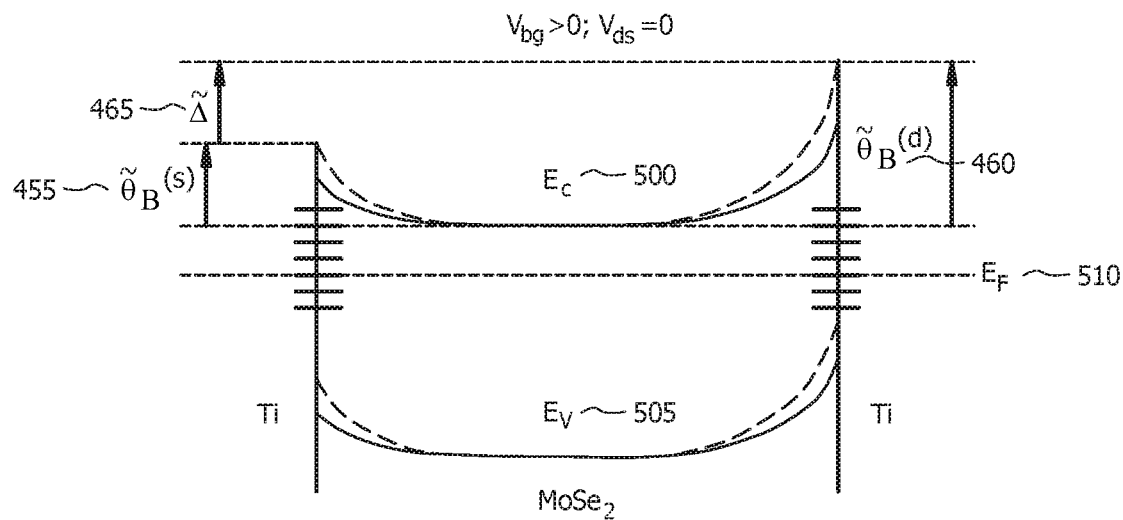

FIG. 11B is an illustration of an effective band scheme for the three exemplary FETs, assuming non-identical contacts exhibiting a difference Δ in the size of their respective Schottky barriers $\phi_B$ between $MoSe_2$ and the Ti contacts. Dotted line represents the scheme of the bands in absence of a gate voltage. The application of a gate voltage suppresses the band bending at the contacts as illustrated by the solid lines.

Figure 11C:
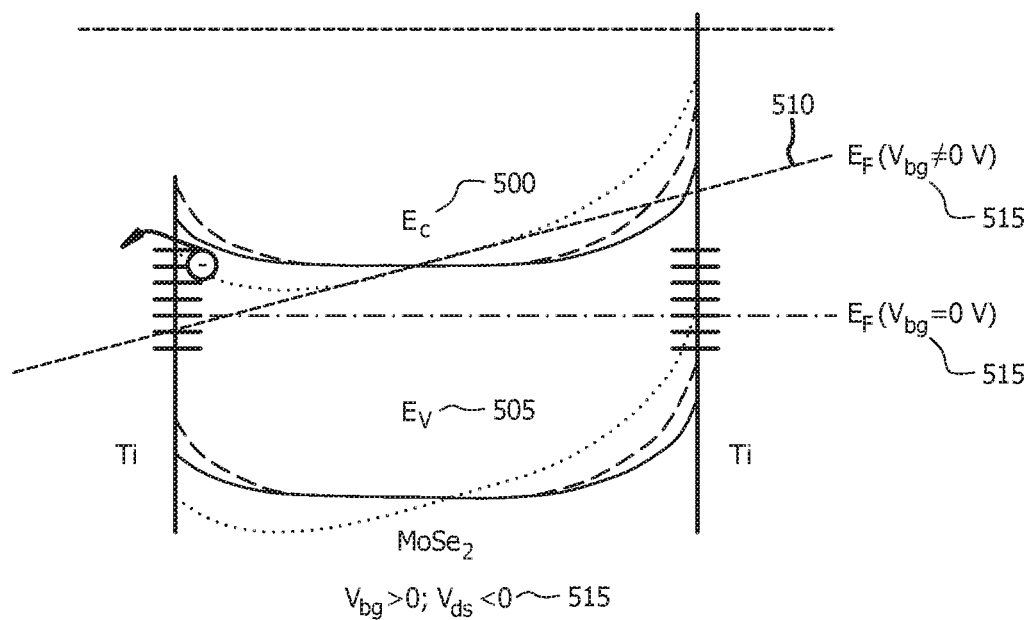

FIG. 11C is an illustration of the same effective band scheme in FIG. 11B, under an applied positive bias voltage.

Figure 11D:
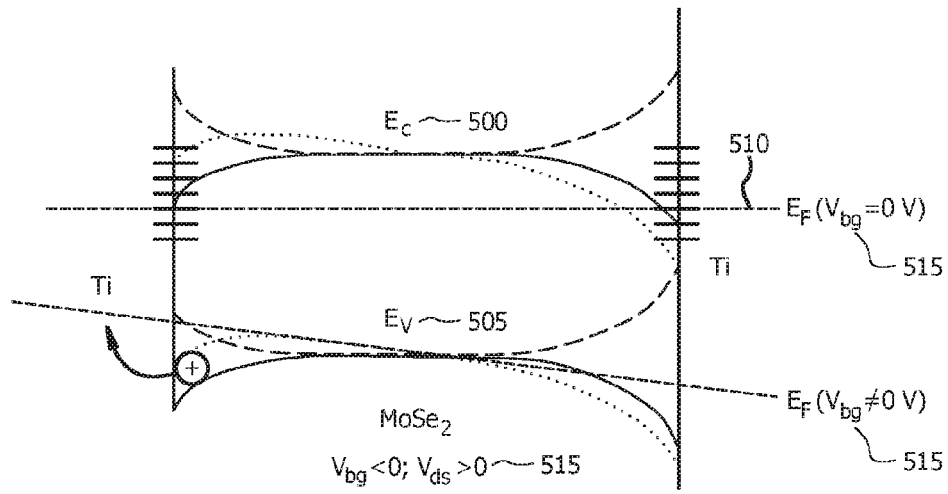

FIG. 11D is an illustration of the effective band scheme of the exemplary FETS under an applied negative bias voltage.

Figure 12A:
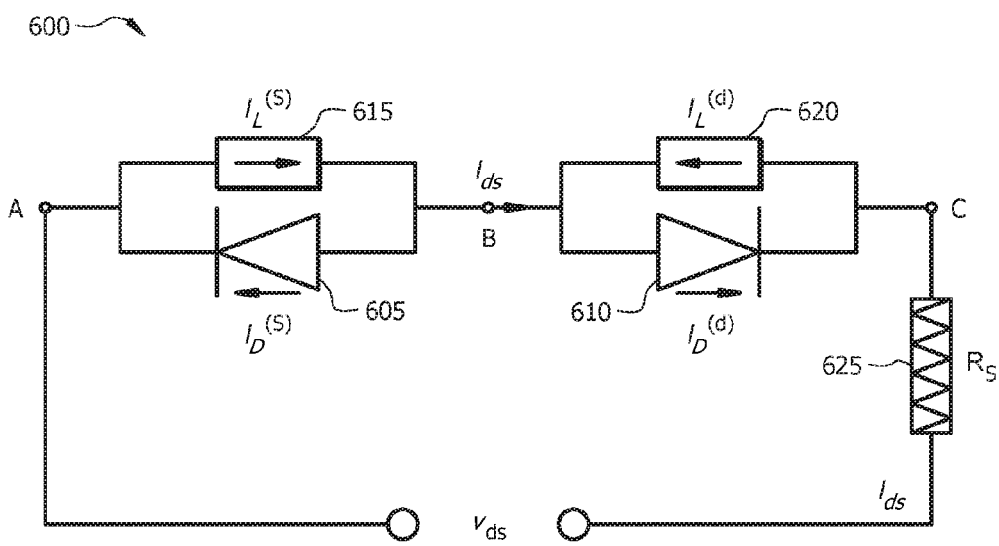

FIG. 12A is an illustration of an equivalent circuit which is believed to capture the observed behavior of the exemplary FETs of the present invention, wherein each contact is characterized by a Schottky diode whose rectification flows in the opposite sense with respect to one another.

Figure 12B:
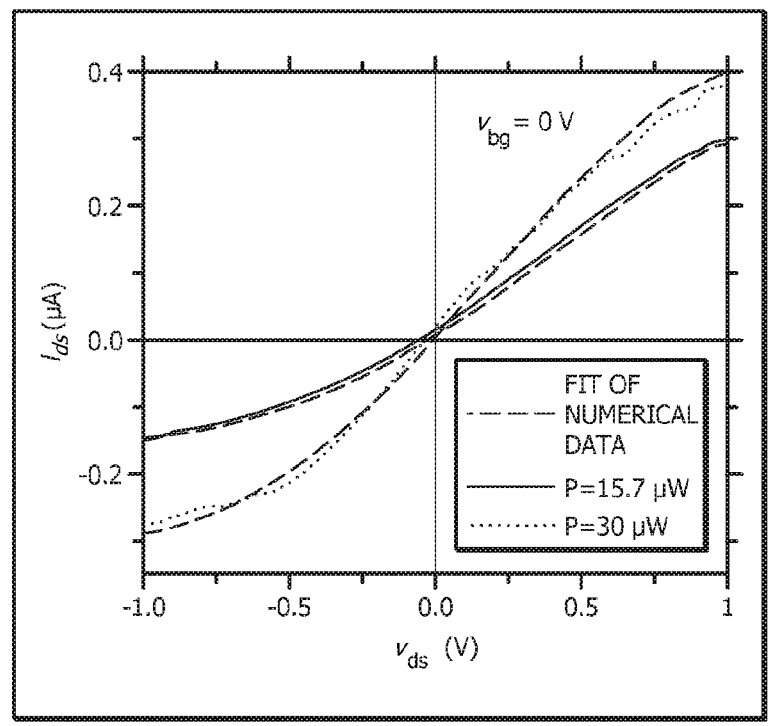

FIG. 12B is a graphical illustration of the fits of experimental data from a second exemplary FET, under $V_{bg}$=0V and two values of the illumination power $P_{opt}$, 15.7 μW and 30 μW, to the dual Schottky circuit model in FIG. 12A.

Figure 12C:
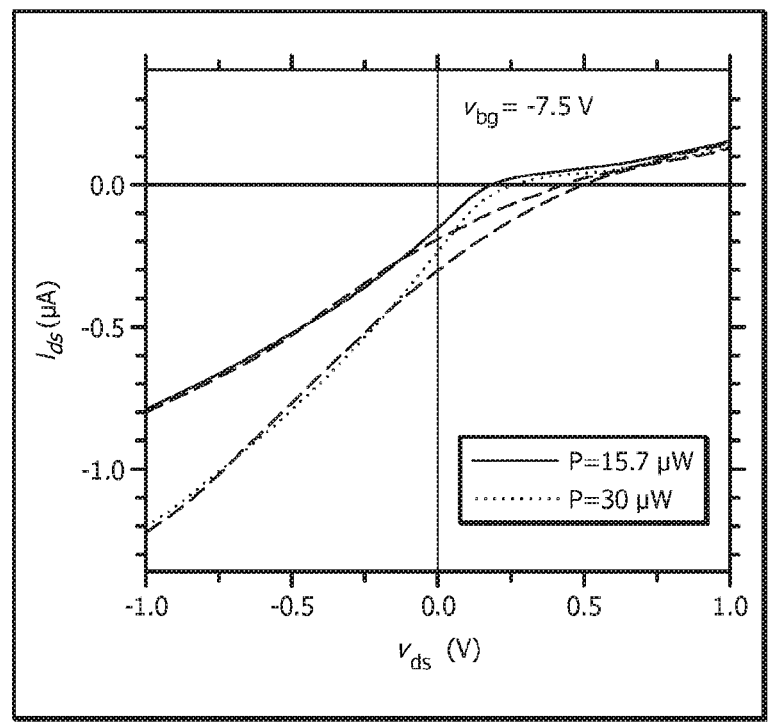

FIG. 12C is a graphical illustration of the fits of experimental data from a first exemplary FET, under $V_{bg}$=−7.5V and two values of the illumination power $P_{opt}$, 15.7 μW and 30 μW, to the dual Schottky circuit model in FIG. 12A.

FIG. 13A is a table illustrating the value of the parameters for the first exemplary FET embodiment obtained by fitting the experimental results under various conditions.

Figure 14A:
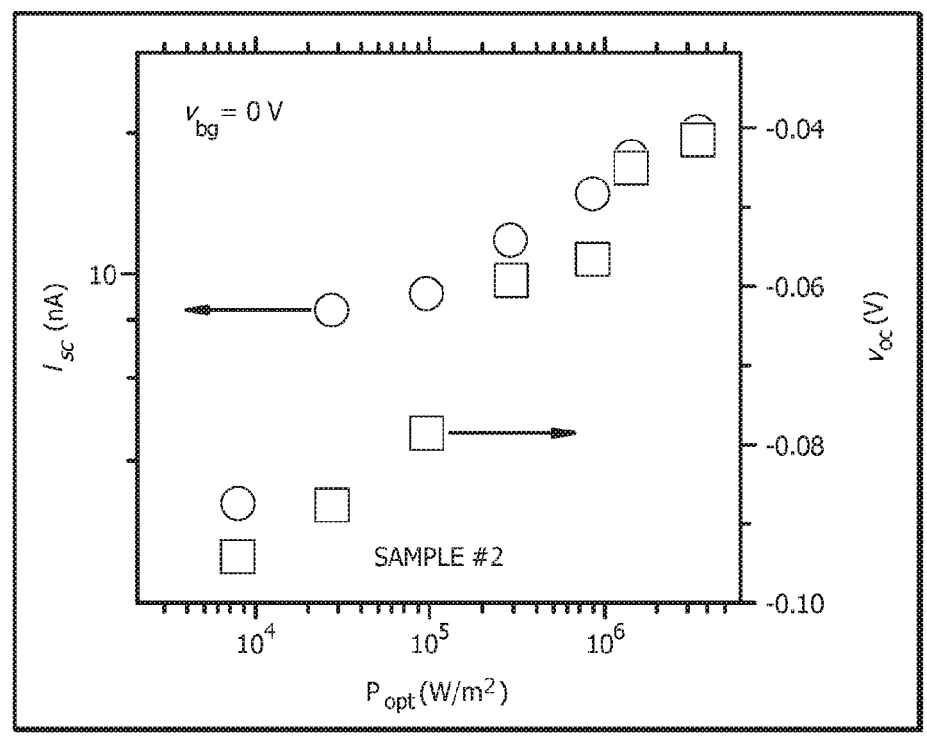

FIG. 13B is a table illustrating the value of the parameters for the second exemplary FET embodiment obtained by fitting the experimental results under various conditions FIG. 14A is a graphical illustration of short-circuit current $I_{sc}=I_{ds}(V_{ds}=0V)$ and open-circuit voltage $V_{oc}=V_{ds}(I_{ds}=0\ A)$ as functions of the applied illumination power density $p_{opt}$ for the second exemplary optical FET under zero gate voltage.

Figure 14B:
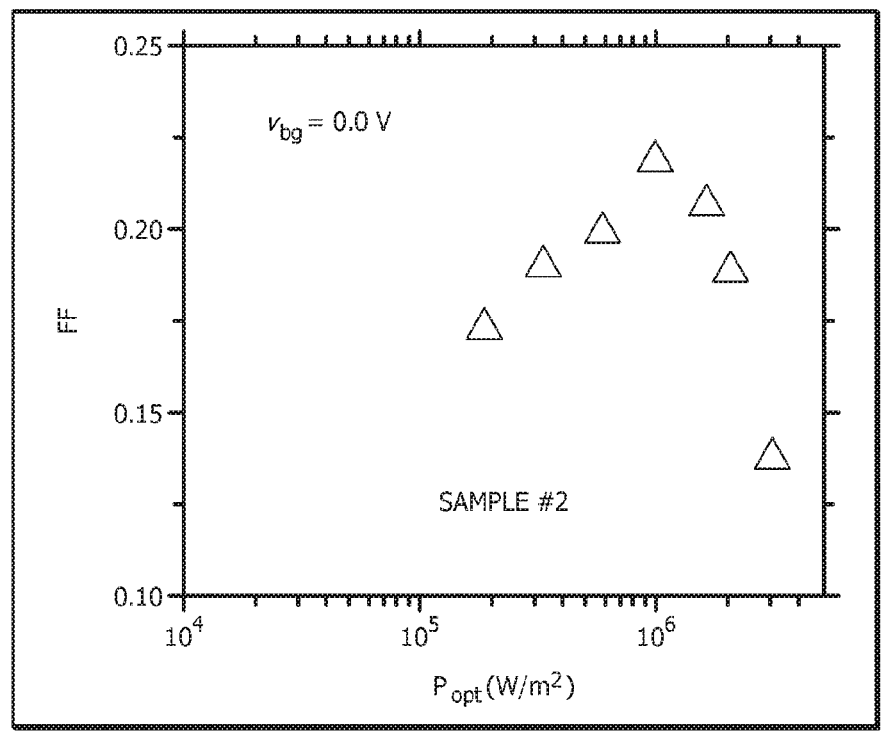

FIG. 14B is a graphical illustration of fill factor $FF=P_{el}^{max}/(I_{sc} \times V_{oc})$ as a function of $p_{opt}$, for the second exemplary optical FET.

Figure 14C:
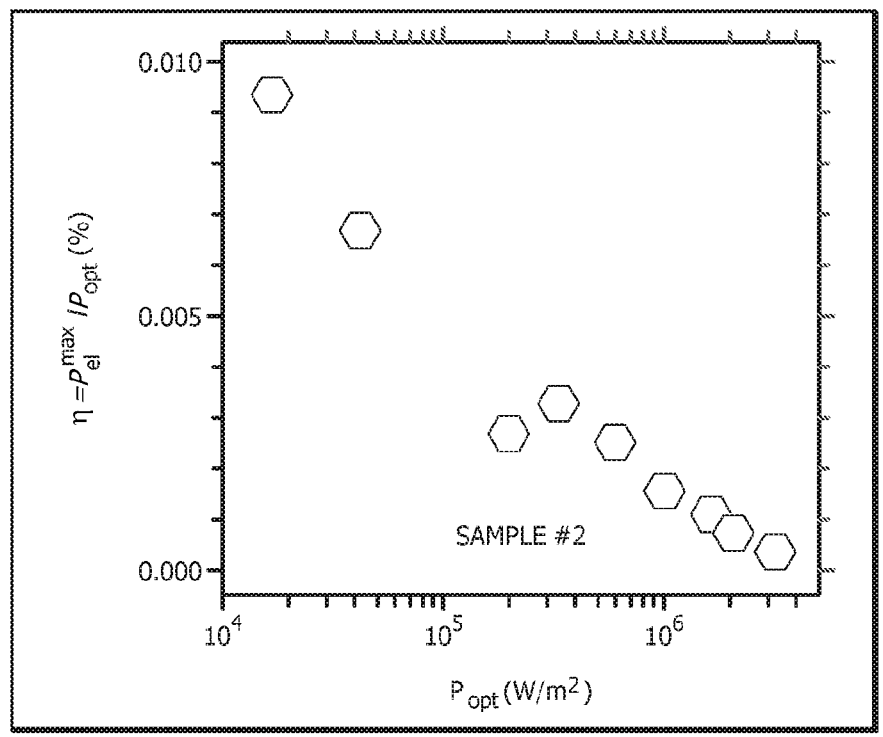

FIG. 14C is a graphical illustration of photovoltaic efficiency η defined here as $P_{el}^{max}/P_{opt}$, wherein $P_{opt}$ is total illumination power, as a function of $p_{opt}$ under $V_{bg}$=0V, for the second exemplary optical FET.

Figure 14D:
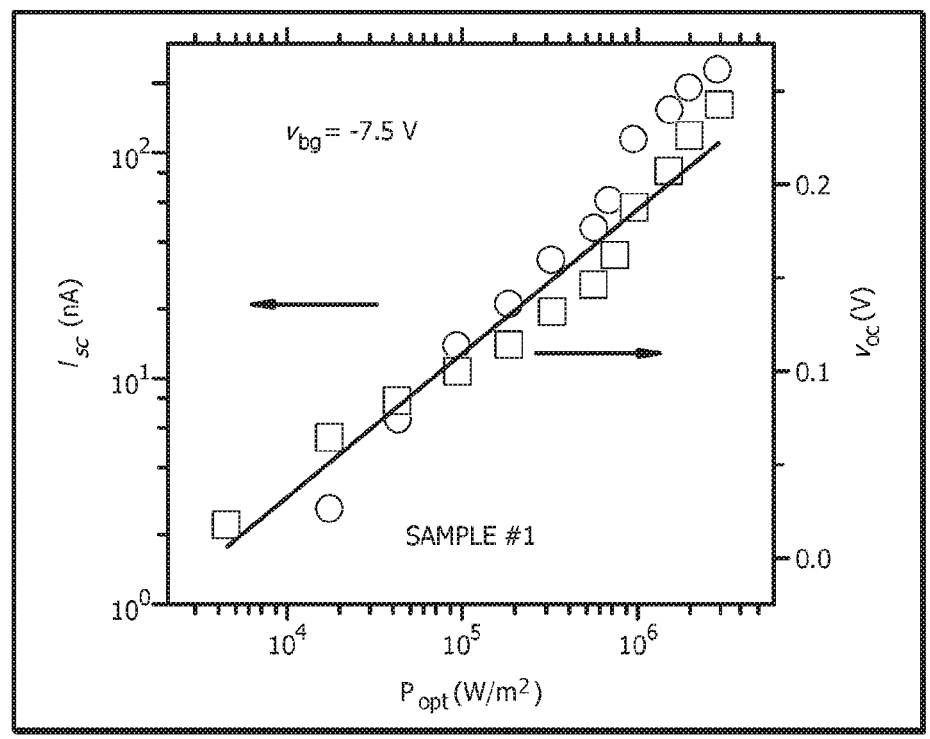

FIG. 14D is a graphical illustration of short-circuit current $I_{sc}=I_{ds}(V_{ds}=0V)$ and open-circuit voltage $V_{oc}=V_{ds}(I_{ds}=0\ A)$ as functions of the applied illumination power density $p_{opt}$ for the first exemplary FET, under $V_{bg}$=−7.5 V.

Figure 14E:
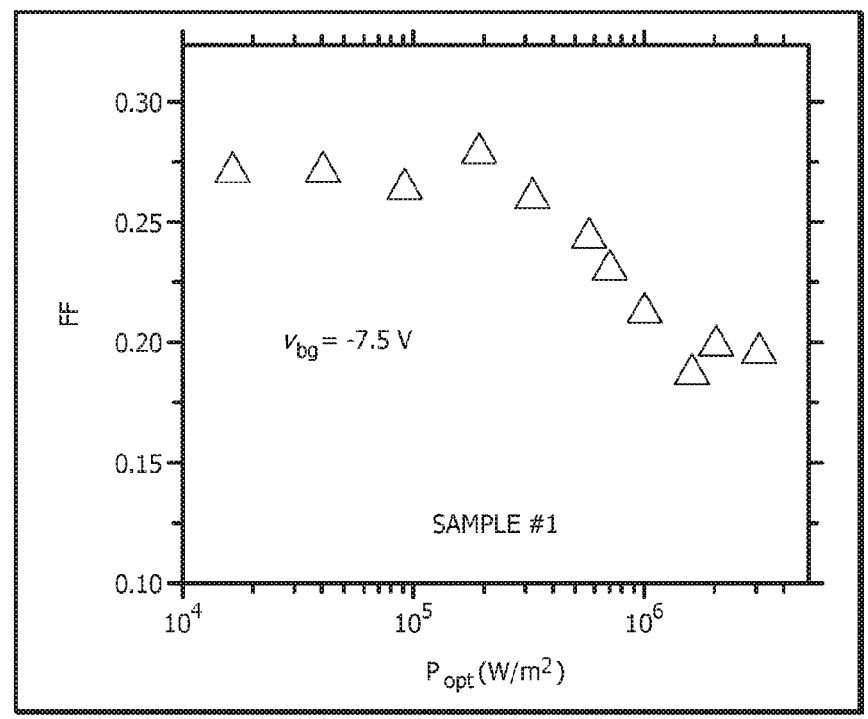

FIG. 14E is a graphical illustration of fill factor $FF=P_{el}^{max}/(I_{sc} \times V_{oc})$ as a function of $p_{opt}$, for the first exemplary optical FET, under $V_{bg}$=−7.5 V.

Figure 14F:
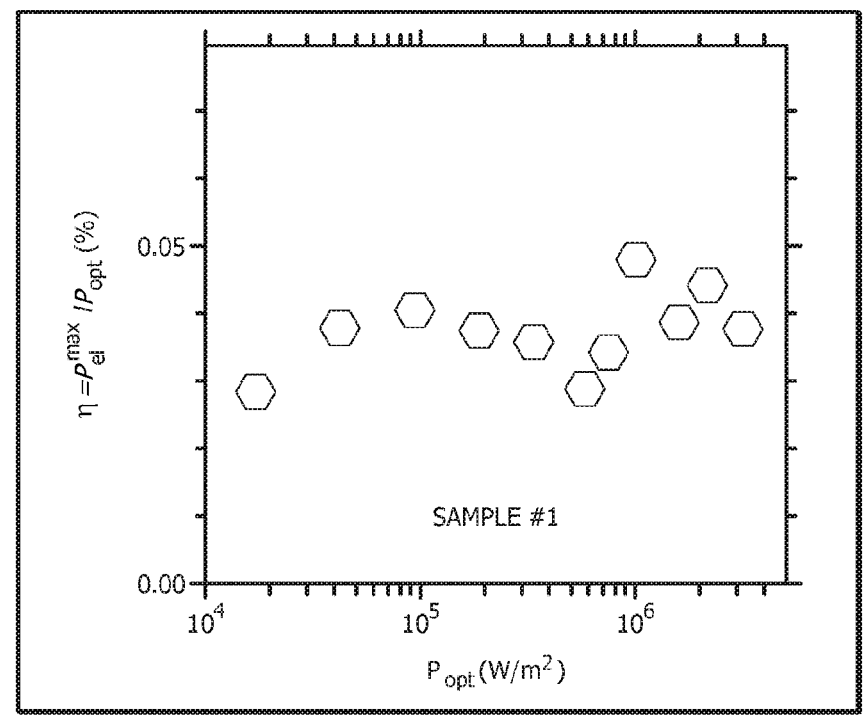

FIG. 14F is a graphical illustration of photovoltaic efficiency η defined here as $P_{el}^{max}/P_{opt}$, wherein $P_{opt}$ is total illumination power, as a function of $p_{opt}$ under $V_{bg}$=−7.5 V, for the first exemplary optical FET.

DETAILED DESCRIPTION OF THE INVENTION

The present invention describes a multi-layered transition metal dichalcogenide (TMD) based optical field-effect transistor (FET) switch having a light-induced diode-like response resulting from a difference in the size of the Schottky barriers between the drain and source contacts of the FET. In the optical FET switch of the present invention, each Schottky barrier can be modeled as a Schottky diode but with opposite senses of current rectification, wherein the diode response results from the light induced promotion of photo-generated carriers across the smaller of the Schottky barriers. The sense of current rectification can be controlled by a back-gate voltage which is able to modulate the relative amplitude between both Schottky barriers yielding a photovoltaic response.

Figure 1A:
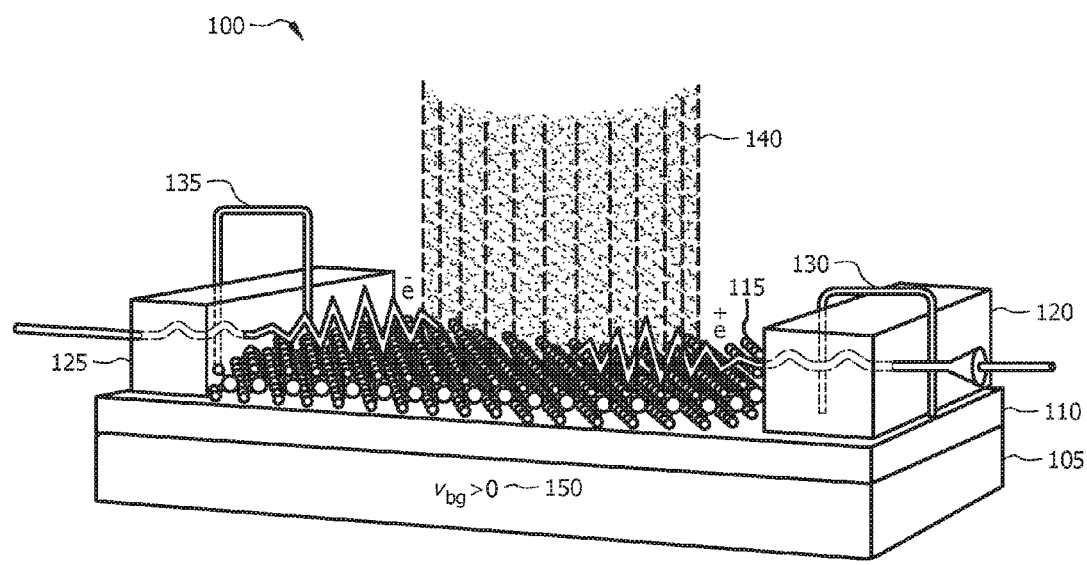
FIG. 1A is an illustration of a $MoSe_2$ field-effect transistor under illumination and an applied positive back gate voltage, in accordance with an embodiment of the present invention.
Figure 1B:
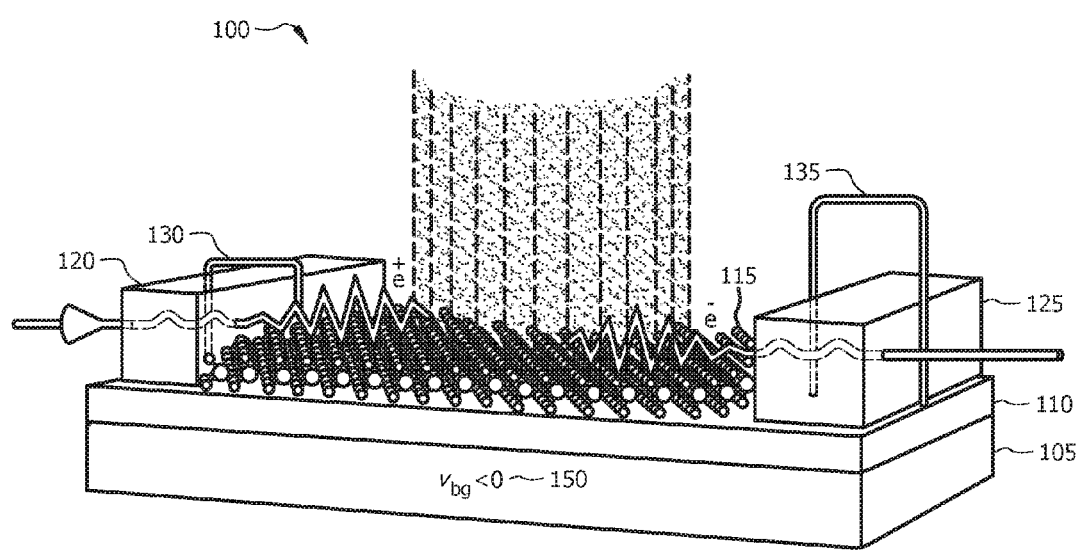
FIG. 1B is an illustration of a $MoSe_2$ field-effect transistor under illumination and an applied negative back gate voltage, in accordance with an embodiment of the present invention.

In a first embodiment, with reference to FIG. 1A-FIG. 1B, an optical field-effect transistor (FET) is illustrated for providing a photovoltaic response. As shown with reference to FIG. 1A and FIG. 1B, a optical FET 100 in accordance with an embodiment of the present invention includes, a semiconductor substrate 105, a dielectric layer 110 positioned over the semiconductor substrate 105, a transition metal dichalcogenides (TMD) layer positioned 115 over the oxide layer 110, a first contact 120 and a second contact 125 positioned on the dielectric layer and in contact with the TMD layer 110 but separated by it 115. In the optical FET 100 of the present invention, a first Schottky diode having a first barrier height 130 is formed at an interface between the first contact 120 and the TMD layer 115 and a second Schottky diode having a second barrier height 135 is formed at an interface between the second contact 125 and the TMD layer 115. In accordance with the present invention, the barrier height 130 of the first Schottky diode and the barrier height 135 of the second Schottky diode are asymmetrical and the sense of current rectification of the first Schottky diode formed at the interface between the first contact 120 and the TMD layer 115 is opposite to the sense of current rectification of the second Schottky diode formed at an interface between the second contact 125 and the TMD layer 115.

As illustrated in the embodiment of FIG. 1A, in the presence of an illumination source 140 and upon the application of a back gate voltage $V_{bg}$ 150 of greater than 0V to the substrate 105 of the optical FET 100, a photogenerated current flows from the first contact 130 to the second contact 135, either in the presence or absence of a bias voltage (photovoltaic effect). In the embodiment of FIG. 1B, in the presence of an illumination source 140 and upon the application of a back gate voltage $V_{bg}$ 150 of less than 0V to the substrate 105 of the optical FET 100, a photo generated current flows from the second contact 135 to the first contact 130. As such, in accordance with the present invention, the back gate voltage can be used to control the sense of current rectification due to the modulation of the Schottky barrier heights between metallic first contact 130, second contact 135 and the TMD layer 115, thereby controlling the direction of current flow through the optical FET 100, as described in more detail below.

In one embodiment, the semiconductor substrate 105 may be a p-doped silicon (Si) wafer and the dioxide layer 110 may be a silicon dioxide ($SiO_2$). However, this is not intended to be limiting and many other semiconductors substrates and dioxide layers, commonly known in the art, are within the scope of the present invention.

Additionally, in a specific embodiment of the invention, the TMD layer 115 may be a molybdenum ($MoSe_2$) layer comprising multi-layered flakes of molybdenum and in a particular embodiment, there may be 7 multi-layers of molybdenum in the TMD layer. However, this is not intended to be limiting and many other layered semiconductors, commonly known in the art, are within the scope of the present invention.

The first contact 130 and the second contact 135 may be comprised of at least one metal, and in a particular embodiment, the first contact 130 is comprised of at least one metal having a first work function and the second contact 135 is comprised of at least one metal having a second work function, wherein the first work function is different than the second work function. The difference in work function leads to the difference in the barrier heights of the Schottky diode formed at the interface of each of the contacts and the TMD layer. In a particular embodiment, the first contact 130 and the second contact 135 are formed of the same metal or the same combination of metals. In an additional embodiment, the first contact 130 and the second contact 135 are formed of different metals. In a specific embodiment, the first contact 130 and the second contact 135 comprise a layer of gold (Au) and a layer of titanium (Ti). In an additional embodiment, the first contact 130 comprises palladium (Pd) and the second contact 135 comprises scandium (Sc). The selection of metals for the contacts is not intended to be limiting and various other metals known in the art are considered within the scope of the present invention.

Figure 2A:
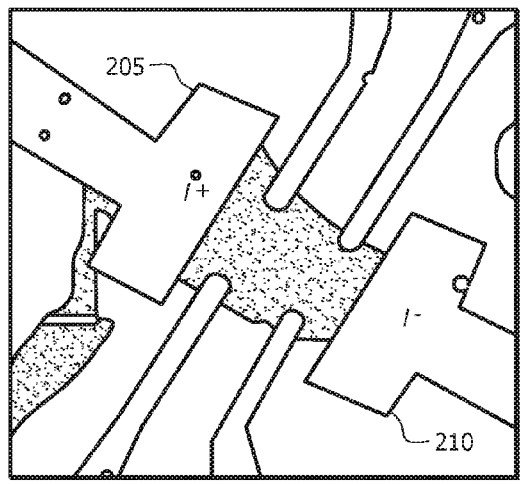
FIG. 2A illustrates a seven-layer $MoSe_2$ field-effect transistor prepared for electrical transport measurements, in accordance with a first exemplary FET embodiment of the present invention.
Figure 2B:
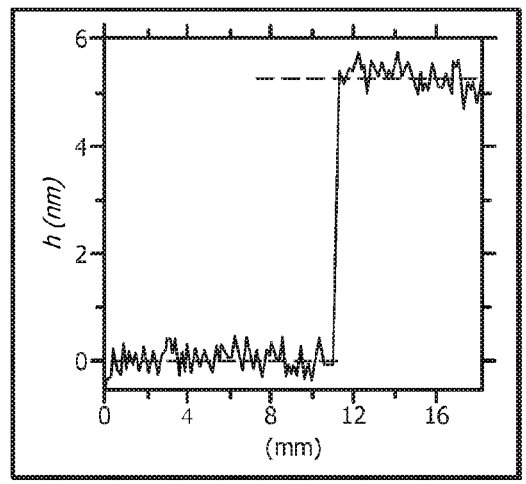
FIG. 2B is a graphical illustration of a height profile collected along the edge of the crystal indicating a thickness of ~5 nm or approximately 7 atomic layers, in accordance with a first exemplary FET embodiment of the present invention.
Figure 2C:
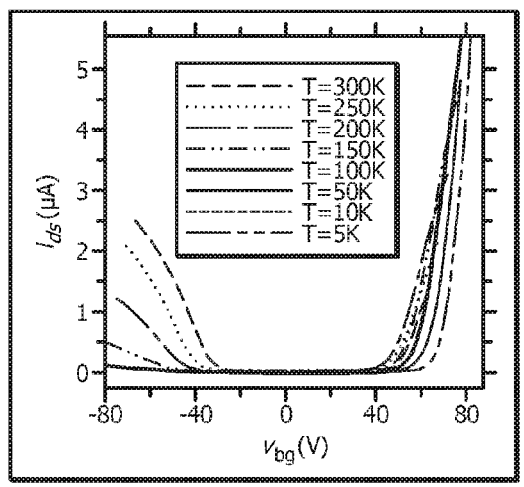
FIG. 2C is a graphical illustration of the drain to source current $I_{ds}$ as a function of the gate voltage $V_{bg}$ under a bias voltage $V_{ds}$=0.1V, and for several temperatures, in accordance with a first exemplary FET embodiment of the present invention.
Figure 2D:
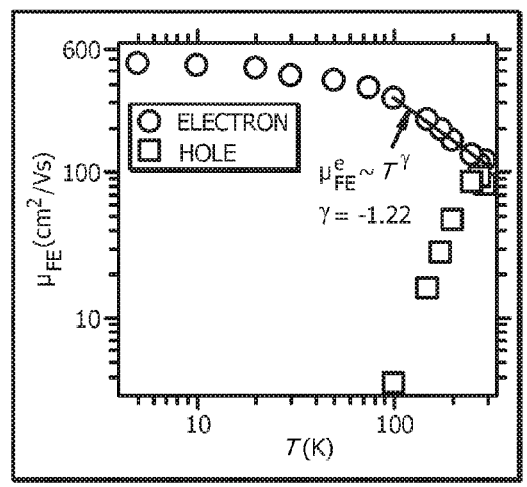
FIG. 2D is a graphical illustration of the respective field-effect mobilities, $\mu_{FE}=1/c_g\ d\sigma/dV_{bg}$, where $c_g$ is the gate capacitance and $\sigma$ the conductivity, as a function of the temperature T, in accordance with a first exemplary FET embodiment of the present invention.

In a first exemplary embodiment of the present invention, FIG. 2A displays a micrograph of a seven-layer $MoSe_2$ field-effect transistor prepared for electrical transport measurements in accordance with a first exemplary embodiment in which the $MoSe_2$ field-effect transistor is fabricated on $SiO_2$ and includes drain ($I^+$) 205 and source ($I^-$) 210 current contacts, as indicated in FIG. 2A. Two-terminal measurements of the device shown in FIG. 2A are described, wherein both the voltage and the electrical current are read and biased through the drain ($I^+$) 205 and the source ($I^-$) 210 contacts. FIG. 2B illustrates a height profile collected along the edge of the $MoSe_2$ crystal indicating a thickness of ~5 nm and an interlayer spacing c=6.4655 A, yielding approximately 7 atomic layers of $MoSe_2$. FIG. 2C illustrates the drain to source current $I_{ds}$ as a function of the back gate voltage $V_{bg}$ under a bias voltage $V_{ds}$=0.1 V, and for several different temperatures. As illustrated in FIG. 2C, assuming the drain and source contacts are Ti:Au, $MoSe_2$ displays ambipolar behavior, yielding a sizeable $I_{ds}$ for both positive (accumulation of electrons in the channel) and negative (accumulation of holes in the channel) back gate voltages. In this exemplary embodiment, far more current is extracted for electrons accumulated in the channel when compared to the holes, particularly at lower temperatures. FIG. 2D illustrates the respective field-effect mobilities $\mu_{FE}=1/c_g \, d\sigma/dV_{bg}$ as a function of the temperature T, where $c_g=\epsilon_r\epsilon_0/d=12.789\times 10^{-9}$ F/cm$^2$ is the gate capacitance for a d=270 nm thick $SiO_2$ layer, and $\sigma=l \, I_{ds}/wV_{ds}$ is the conductivity for a channel of width w and length l. Here, $d\sigma/dV_{bg}$ was approximated to a simple linear fit of $I_{ds}(V_{bg})$ taken at high values of $I_{ds}$. As seen, although the electron field-effect mobility, or $\mu^e_{FE}$, is observed to increase and saturate, the hole-mobilities, or $\mu^h_{FE}$, decrease very fast, as T is lowered. The solid line is a linear fit yielding $\mu^e_{FE} \propto T^{-1.22}$ which most likely reflects the suppression of phonon scattering. It is seen that for this first exemplary FET, $\mu^e_{FE}$ saturates at a value of ~600 cm$^2$/Vs at low temperatures. It can be seen that the observed low temperature values are higher than those extracted for multi-layered $MoS_2$ or for multi-layered $WSe_2$ contacted with graphene and gated by using an ionic liquid.

Figure 3A:
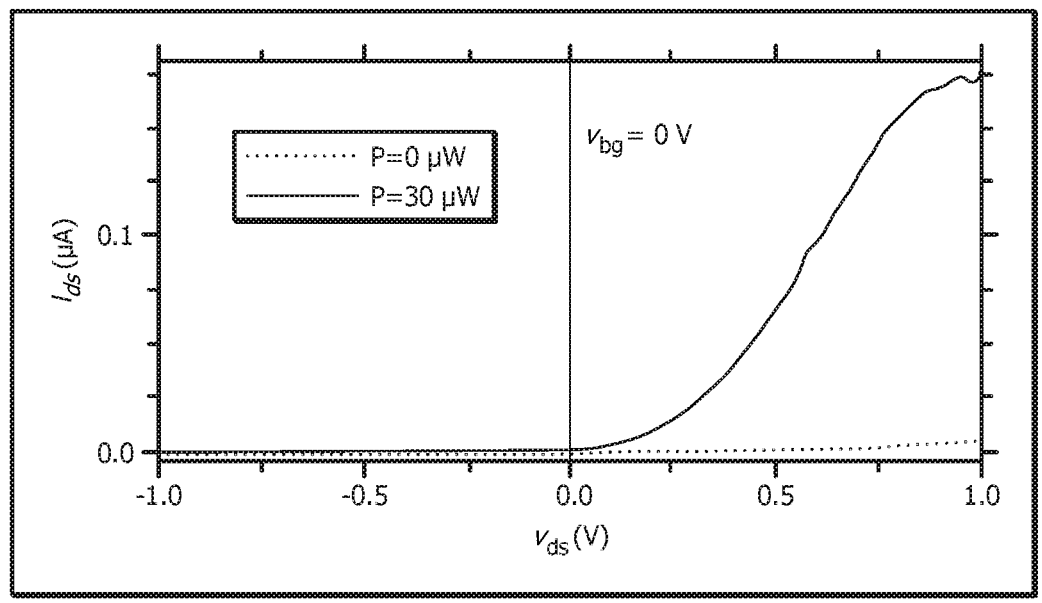
FIG. 3A is a graphical illustration of $I_{ds}$ as a function of the bias voltage $V_{ds}$ under zero gate-voltage, under dark conditions and under illumination, in accordance with a first exemplary FET embodiment of the present invention.
Figure 3B:
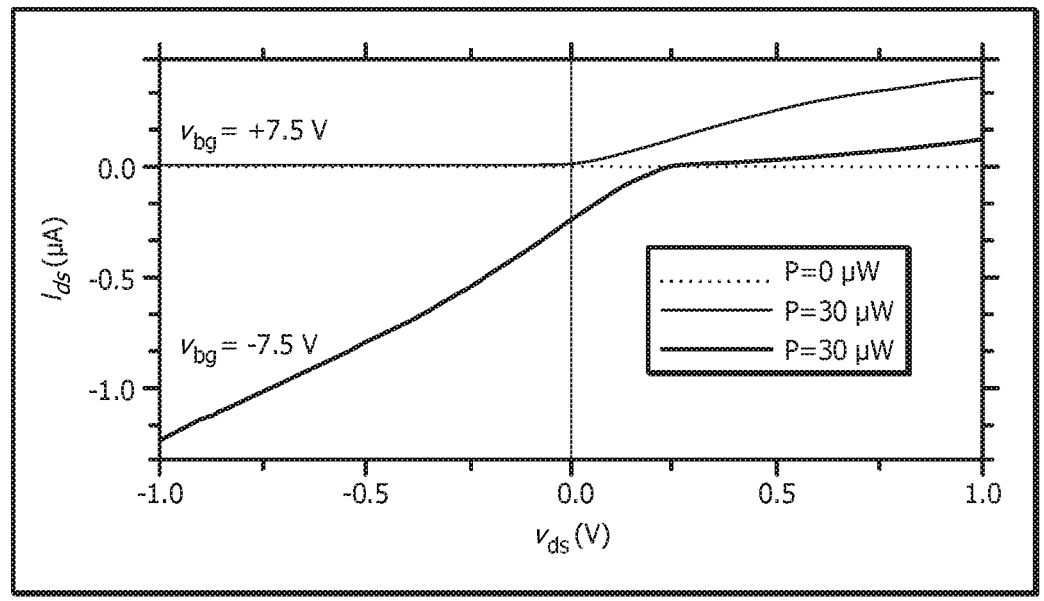
FIG. 3B is a graphical illustration showing how the rectification like behavior of FIG. 3A becomes even more pronounced when a gate voltage $V_{bg}$=+7.5 V is applied, in accordance with a first exemplary FET embodiment of the present invention.
Figure 3C:
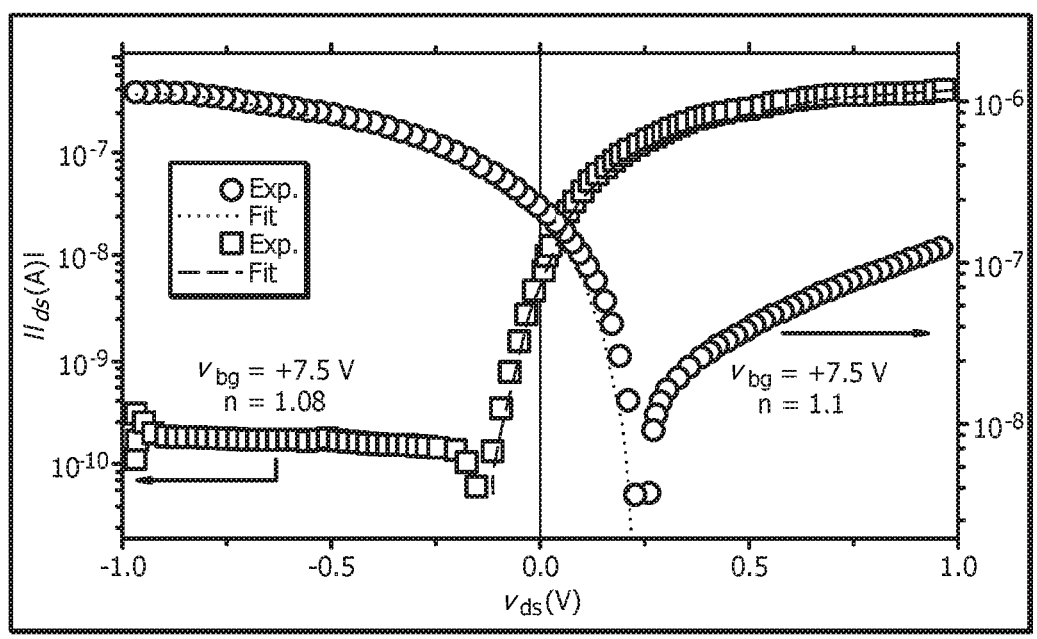
FIG. 3C is a graphical illustration showing how the sense of current rectification can be inverted by inverting the gate voltage, wherein $I_{ds}$ is illustrated as a function of $V_{bg}$ under P=30 μW for $V_{bg}$=+7.5 and −7.5 V, in accordance with a first exemplary FET embodiment of the present invention.

FIG. 3A-FIG. 3C depicts the core innovation of the present invention. FIG. 3A illustrates a plot of $I_{ds}$ as a function of the bias voltage $V_{ds}$ under zero gate-voltage, under both dark conditions (P=0 μW) and under illumination (P>0 μW), in accordance with the first exemplary FET embodiment. An illumination power P=30 μW was applied to the first exemplary FET by a λ=532 nm laser through an optical fiber placed in very close proximity to its surface producing a spot size of 3.5 μm in diameter. Although the I-V characteristics collected under dark conditions was already asymmetric or non-linear as expectable for non-ohmic contacts, it becomes far more asymmetric, and in fact diode-like, when subjected to illumination. As shown in FIG. 3B this rectification like behavior becomes even more pronounced when a gate voltage $V_{bg}$=+7.5 V is applied. It is additionally shown that the sense of current rectification can be inverted by inverting the gate voltage as shown in FIG. 3C, which displays $I_{ds}$ as a function of $V_{bg}$ under P=30 μW for $V_{bg}$=+7.5 and -7.5 V, respectively. The solid lines are fits of the observed diode response to the Shockley equation in the presence of a series resistor:

$$I_{ds} = \frac{nV_T}{R_s} W_0\left(\frac{I_0 R_s}{fV_T}\exp\left(\frac{V+I_0 R_s}{nV_T}\right)\right) - I_0$$

where W is the Lambert function and $V_T$ the thermal voltage, yields an ideality factor n≅1.1 with the series resistance $R_s$ ranging from 0.85 to 2.1 MΩ and $I_0$ from $5\times10^{-11}$ and $2\times10^{-9}$ A. These n values are smaller, or comparable, to those in previously reported (1.9≤n≤2.6) for single layered $WSe_2$ lateral diodes. As such, the Shockley-Read-Hall recombination theory, which assumes recombination via isolated point defect levels, predicts n≤2. Here, it is important to emphasize that the area of the channel $A_c$=6.7×9.4 μm≅63 μm$^2$, implying that the illumination of the channel is responsible for the observed effect since it is possible to easily prevent illumination of the contacts.

Accordingly, in the present invention, the application of illumination power to the optical FET leads to a diode-like response in the field-effect transistor, whose sense of current rectification can be controlled by the gate voltage. Since this response is observed in the absence of a conventional p-n junction it can only be ascribed to the Schottky barriers at the level of the contacts, as will be discussed in detail below.

Figure 4A:
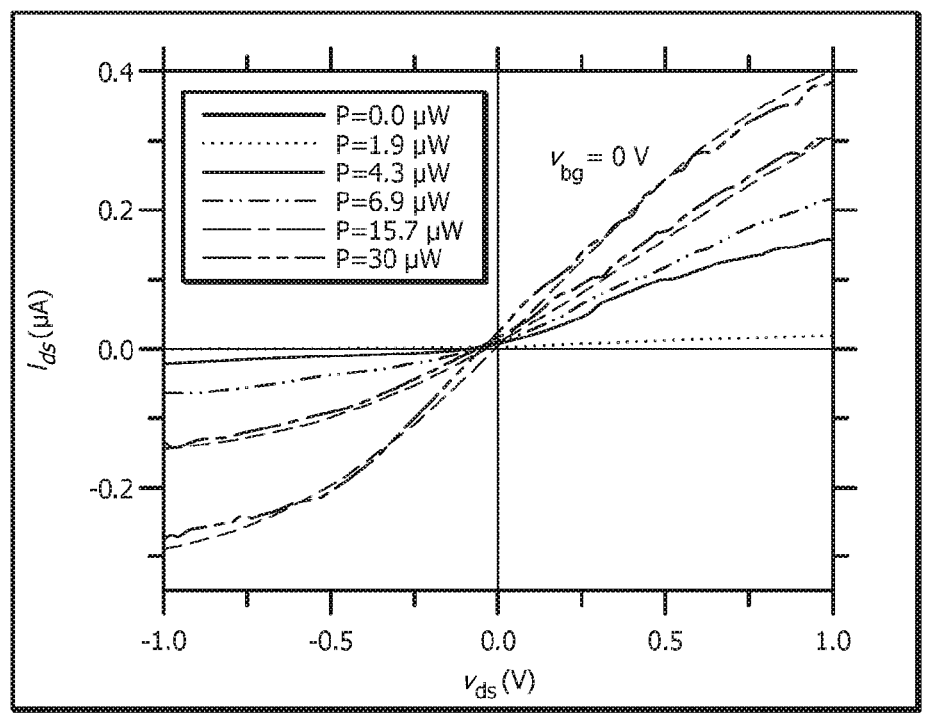
FIG. 4A is a graphical illustration of the current voltage characteristics, including photoresponse and photovoltaic-effect in a $MoSe_2$ transistor under zero gate-voltage, in accordance with a second exemplary FET embodiment of the present invention.
Figure 4B:
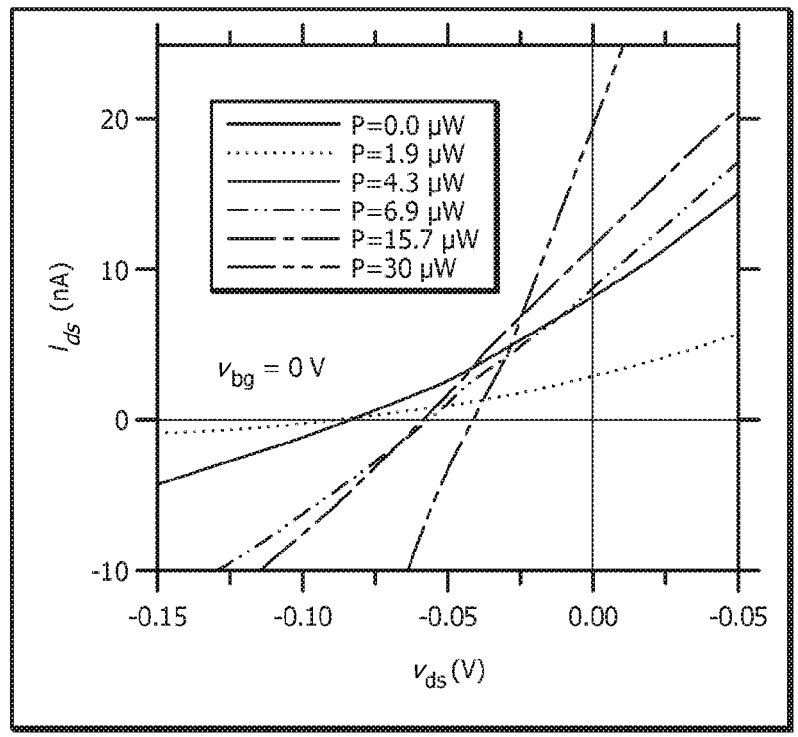
FIG. 4B is a graphical illustration of the same data as in FIG. 4A, but in an amplified scale.
Figure 4C:
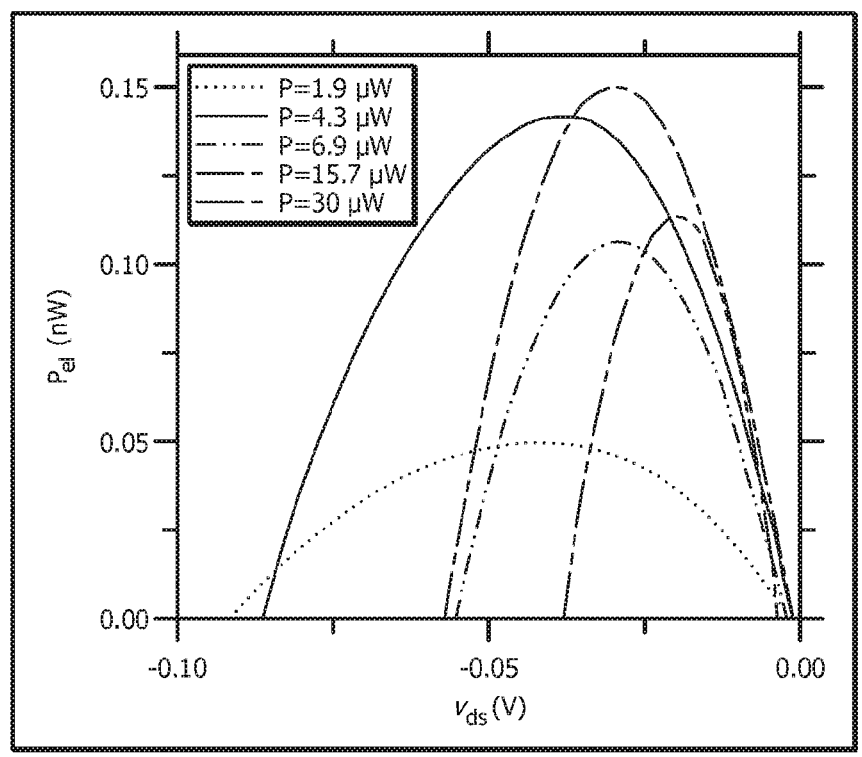
FIG. 4C is a graphical illustration of the photo-generated electrical power $P_{el}$ as a function of $V_{ds}$ from the data in FIG. 4B.
Figure 5A:
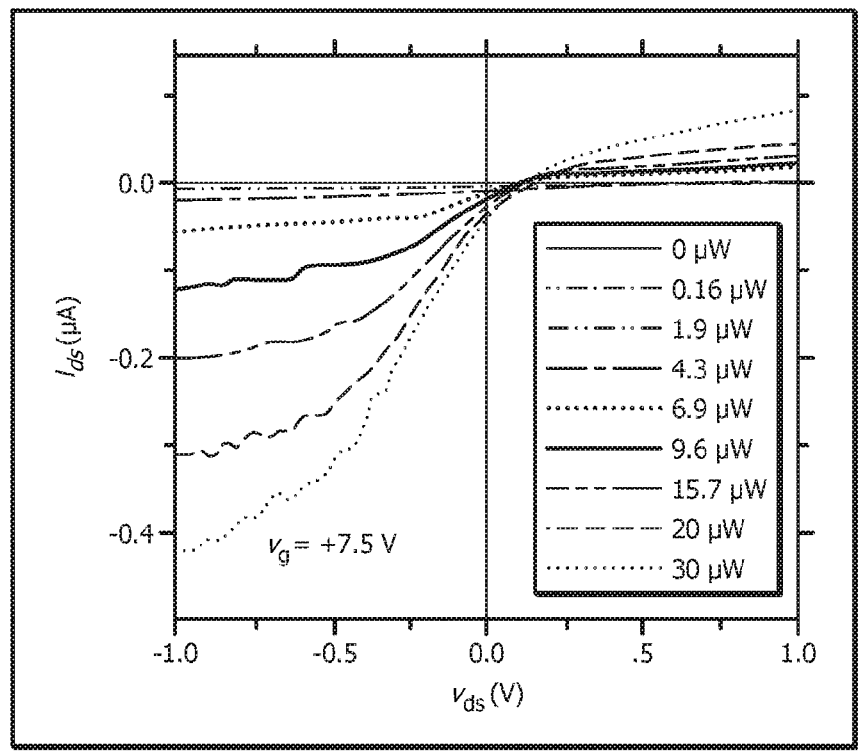
FIG. 5A is a graphical illustration of the drain to source current $I_{ds}$ as a function of the bias voltage $V_{ds}$ for several values of the illumination power and under a gate voltage $V_{bg}$=+7.5 V, in accordance with a second exemplary FET embodiment of the present invention.
Figure 5B:
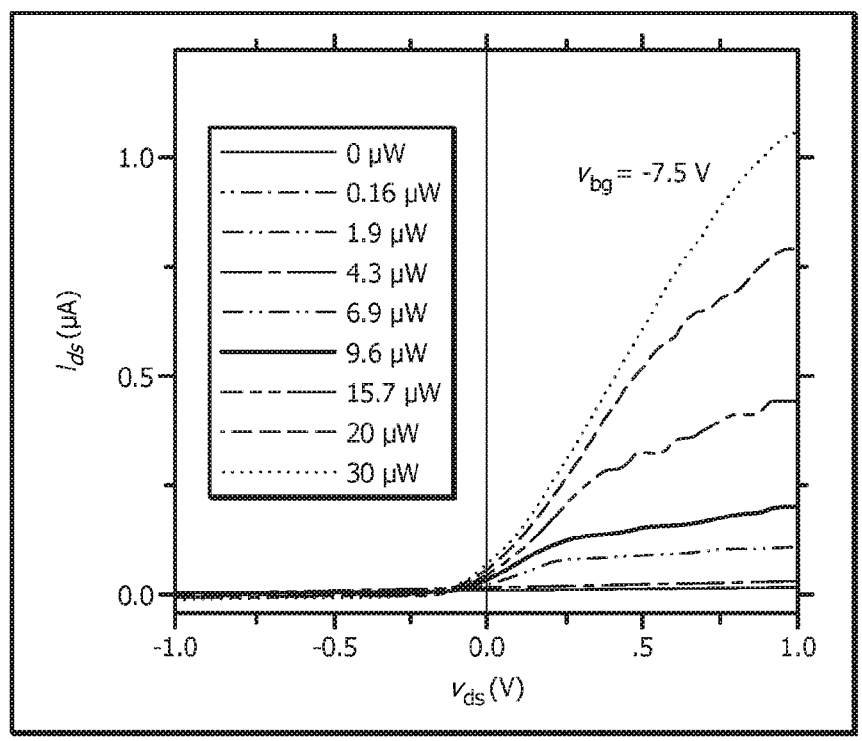
FIG. 5B is a graphical illustration of the same data as in FIG. 5A, but under a gate voltage of $V_{bg}$=−7.5V.
Figure 5C:
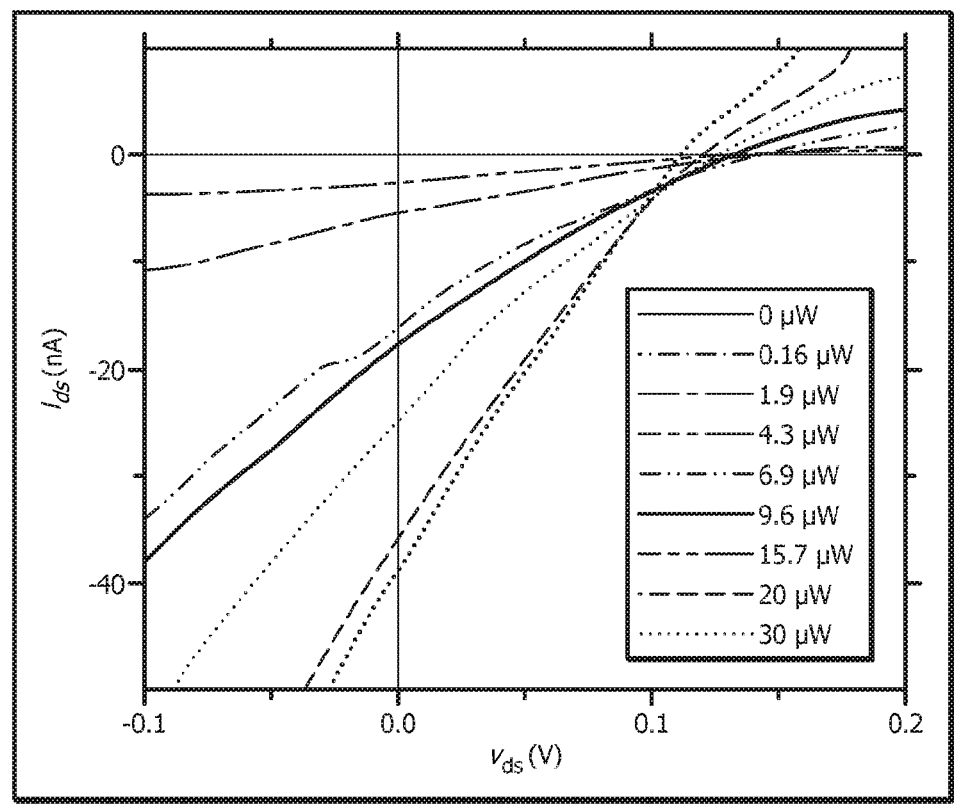
FIG. 5C is a graphical illustration of the same data as in FIG. 5A, but in an amplified scale to expose the photovoltaic response a zero bias voltage.
Figure 5D:
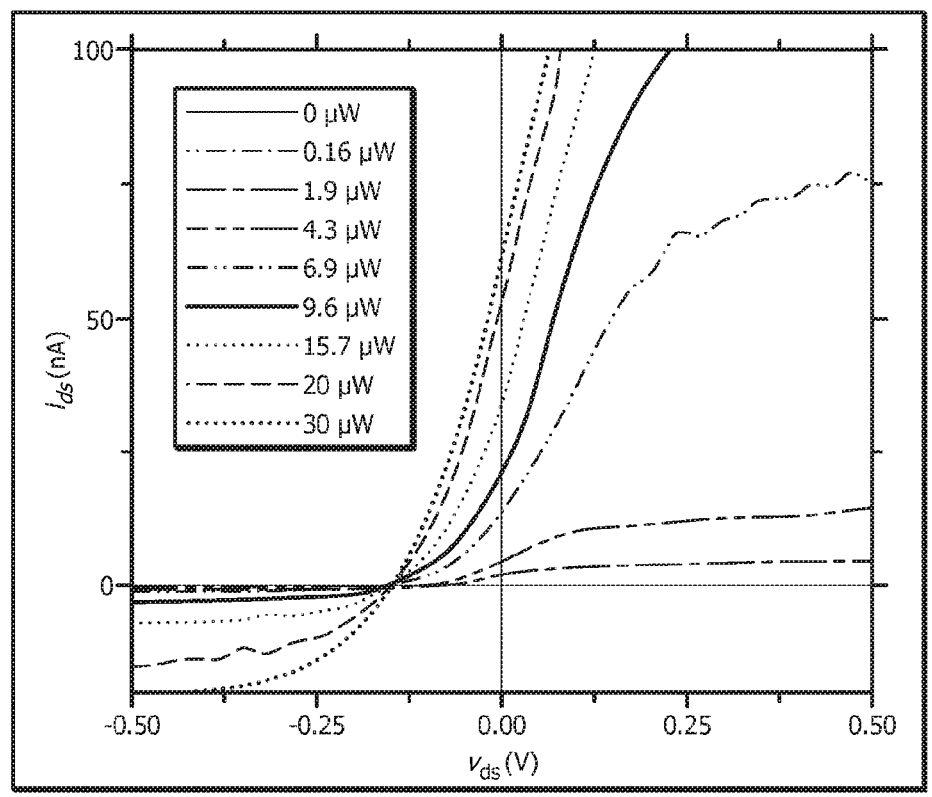
FIG. 5D is a graphical illustration of the same data as in FIG. 5B, but in an amplified scale.
Figure 5E:
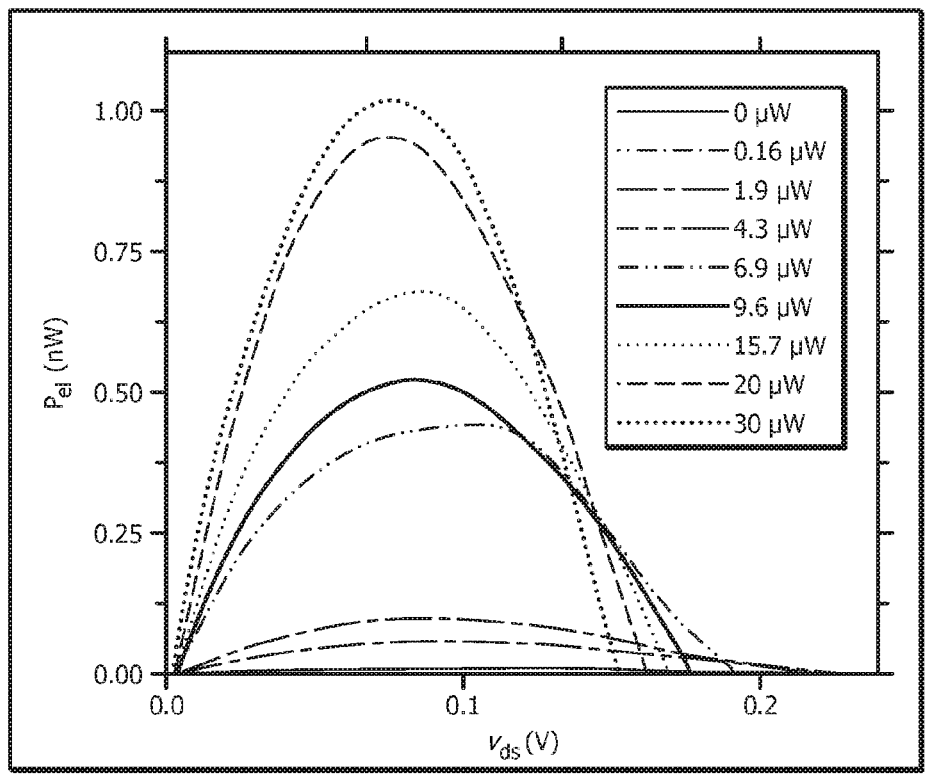
FIG. 5E is graphical illustration of the photogenerated electrical power $P_{el}=I_{ds} \times V_{ds}$ as extracted from the fourth quadrant of FIG. 5C, spanning from $V_{ds}$=0V to $I_{ds}$=0 A.
Figure 5F:
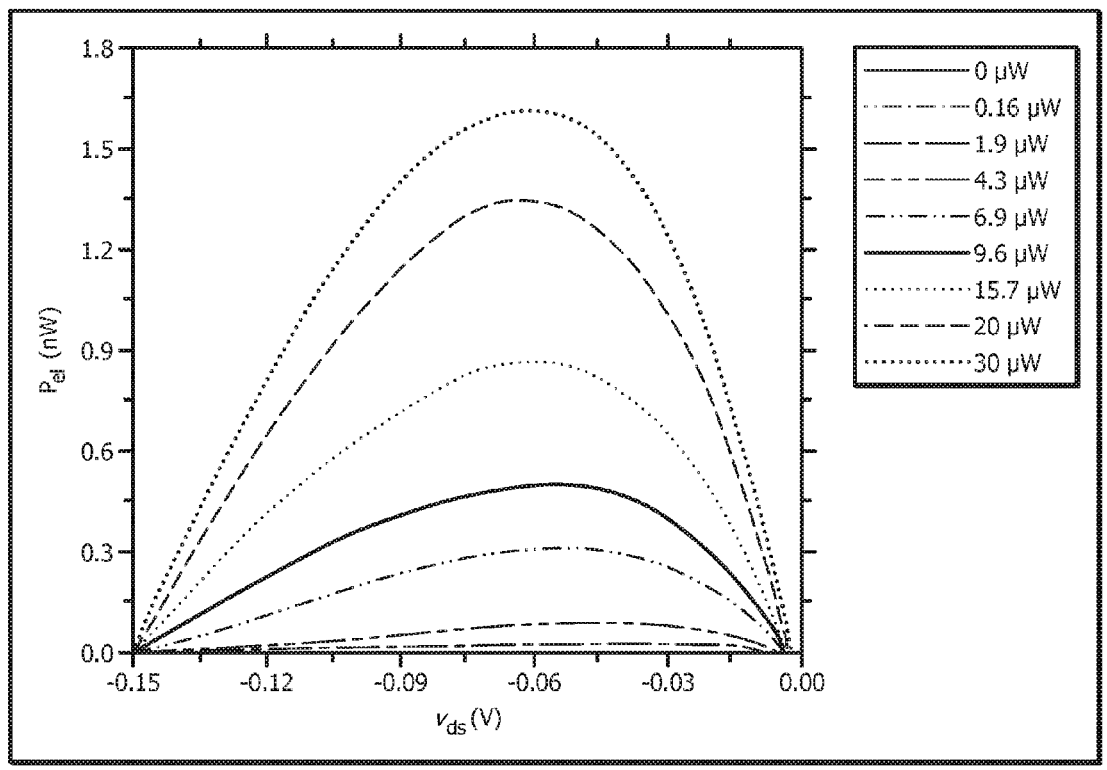
FIG. 5F is a graphical illustration of the photogenerated electrical power $P_{el}=I_{ds} \times V_{ds}$ as extracted from the fourth quadrant of FIG. 5D, spanning from $V_{ds}$=0V to $I_{ds}$=0 A.
Figure 6A:
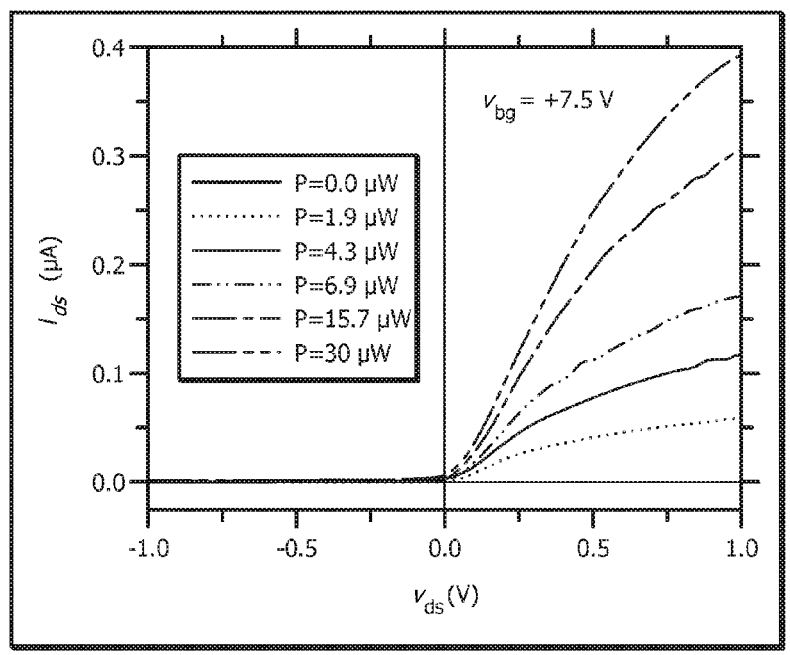
FIG. 6A is a graphical illustration of the drain to source current $I_{ds}$ as a function of $V_{ds}$ for a first exemplary FET, and for several values of the illumination power P, under $V_{bg}$=+7.5 V.
Figure 6B:
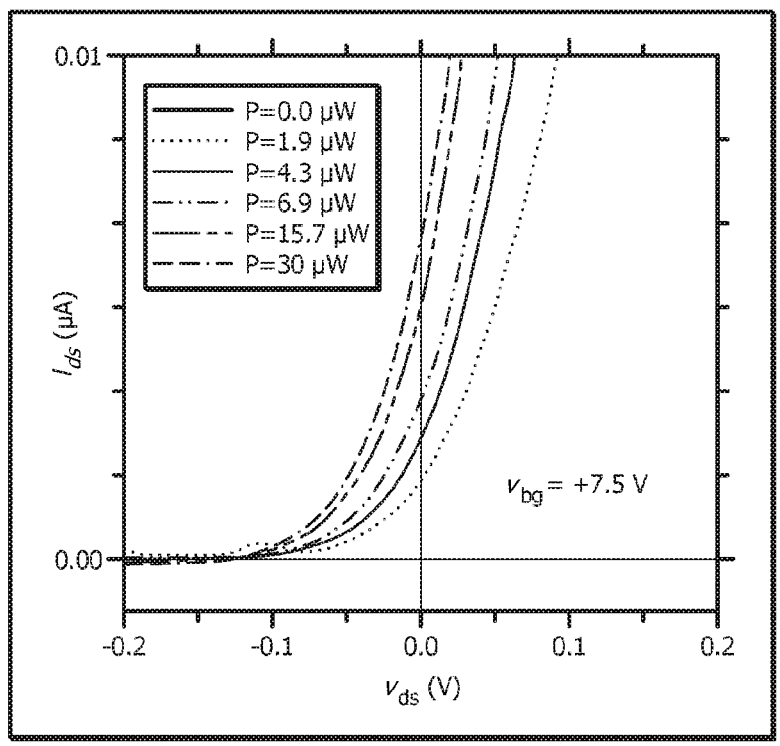
FIG. 6B is a graphical illustration of the same data as in FIG. 6A, but in an amplified scale to expose the short circuit current $I_{sc}=I_{ds}(V_{ds}$=0 V).
Figure 6C:
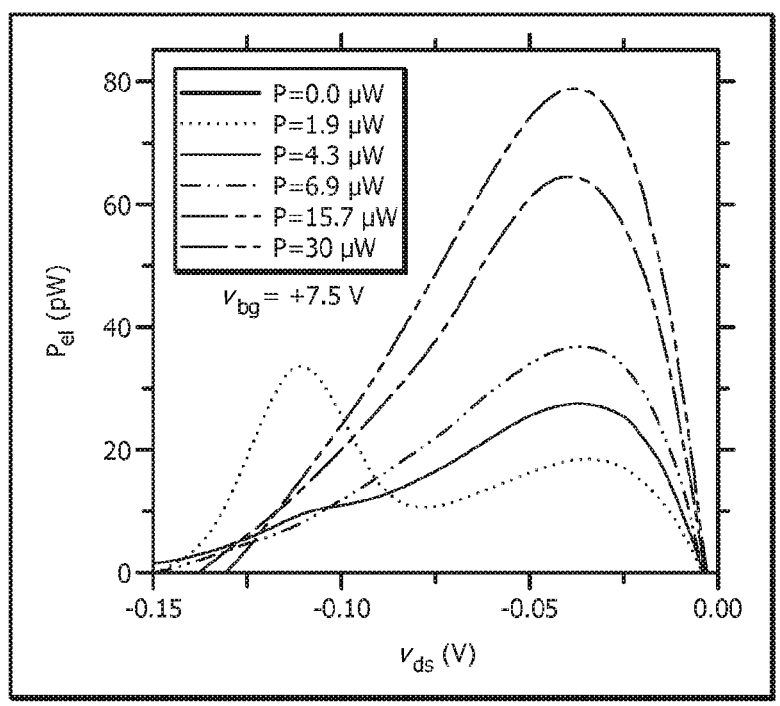
FIG. 6C is a graphical illustration of the photogenerated electrical power $P_{el}=I_{ds} \times V_{ds}$ as a function of $V_{ds}$ from the data in FIG. 6B.
Figure 6D:
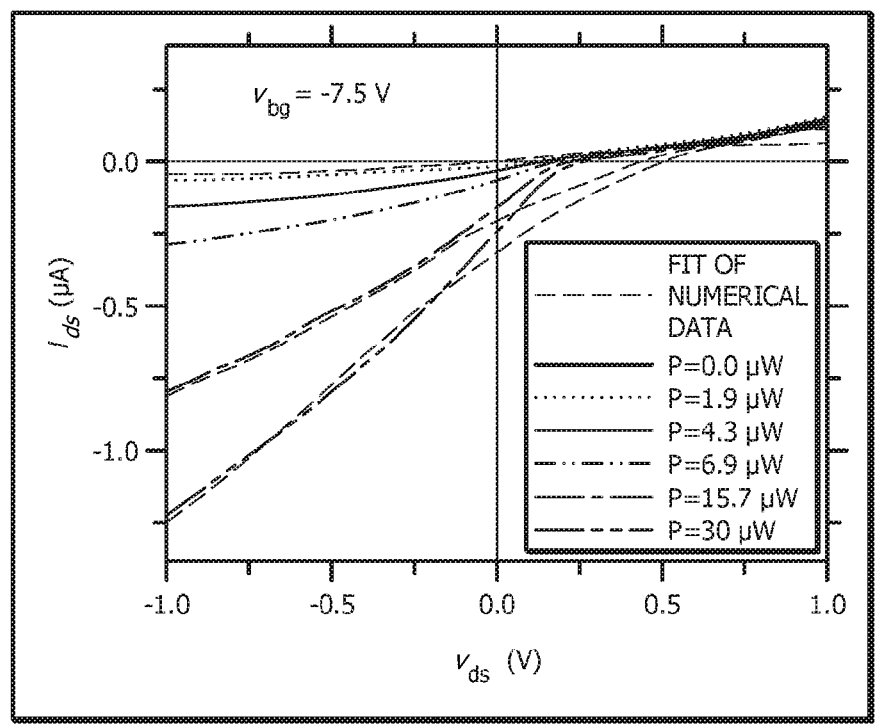
FIG. 6D is a graphical illustration of the same data as in FIG. 6A, but under $V_{bg}$=−7.5V.
Figure 6E:
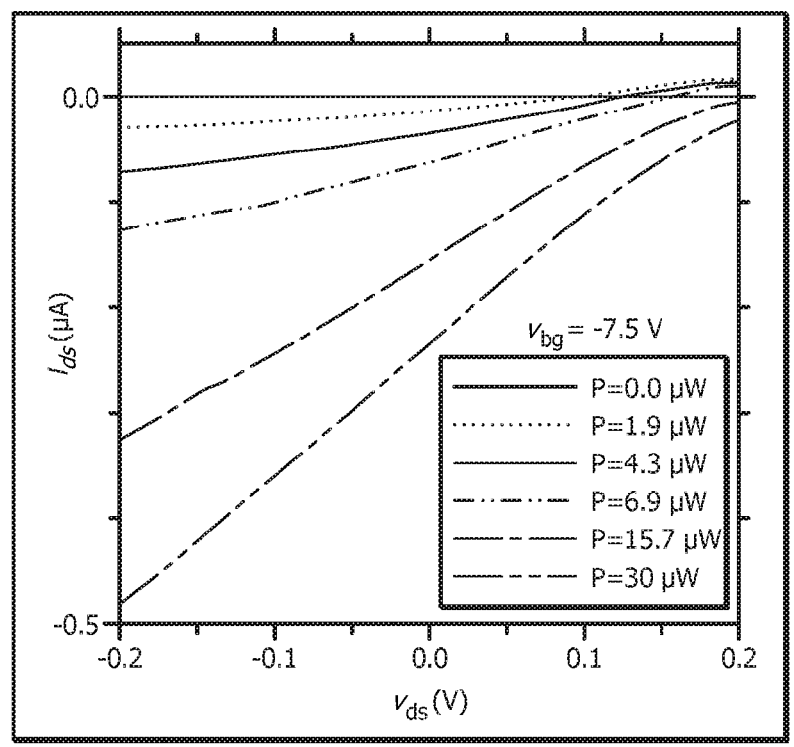
FIG. 6E is a graphical illustration of the same data as in FIG. 6D, but in an amplified scale to expose $I_{sc}$.
Figure 6F:
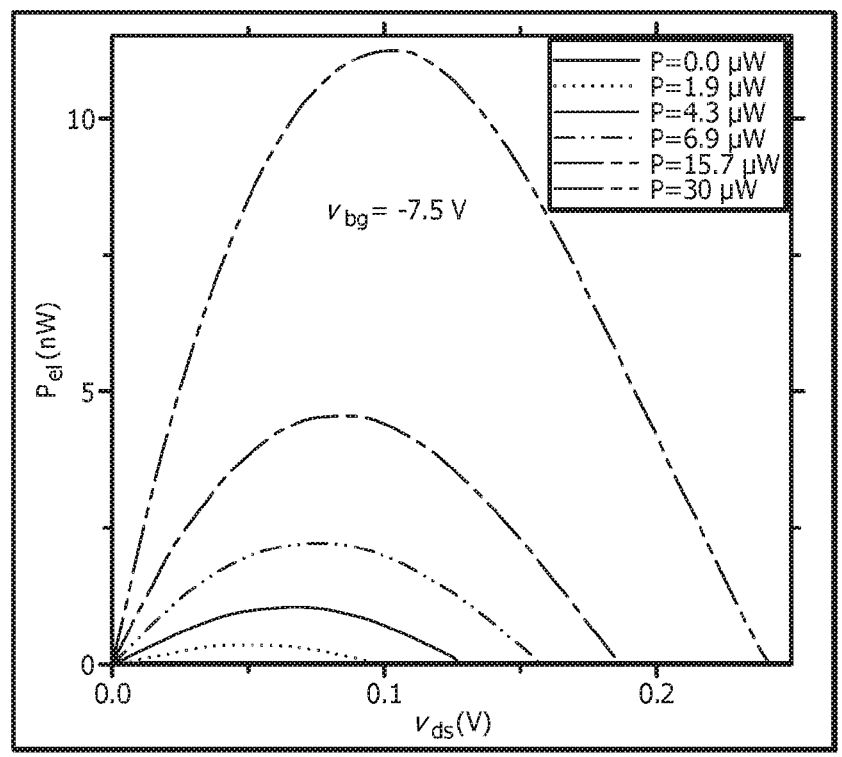
FIG. 6F is a graphical illustration of $P_{el}$ as a function of $V_{ds}$ as extracted from the data in FIG. 6E.
Figure 7A:
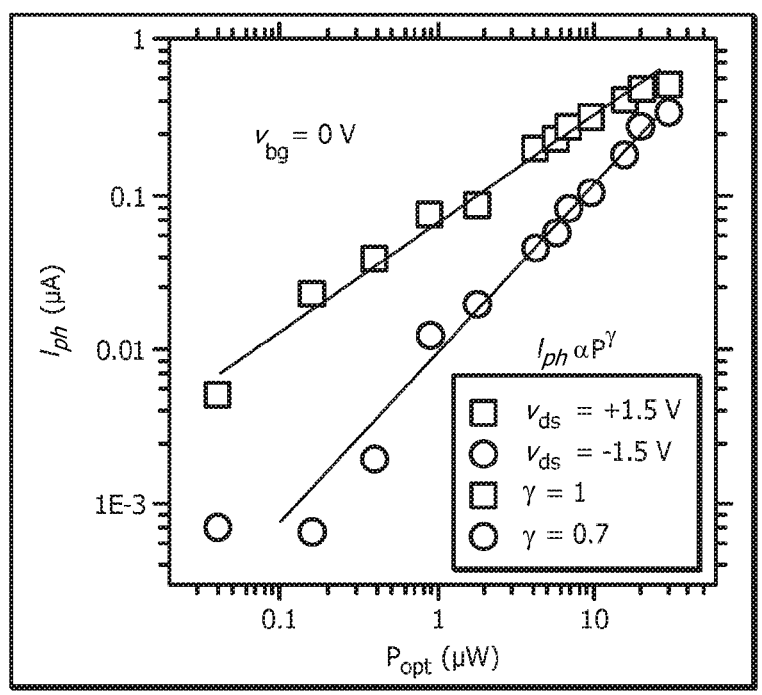
FIG. 7A is a graphical illustration of the photocurrent $I_{ph}$ as a function of the applied optical power $P_{opt}$ in a log-log scale, for two values of the bias voltage $V_{ds}$=+1.5 V and −1.5 V, and zero gate voltage for the a first exemplary FET in accordance with the present invention. The solid lines are logarithmic fits.
Figure 7B:
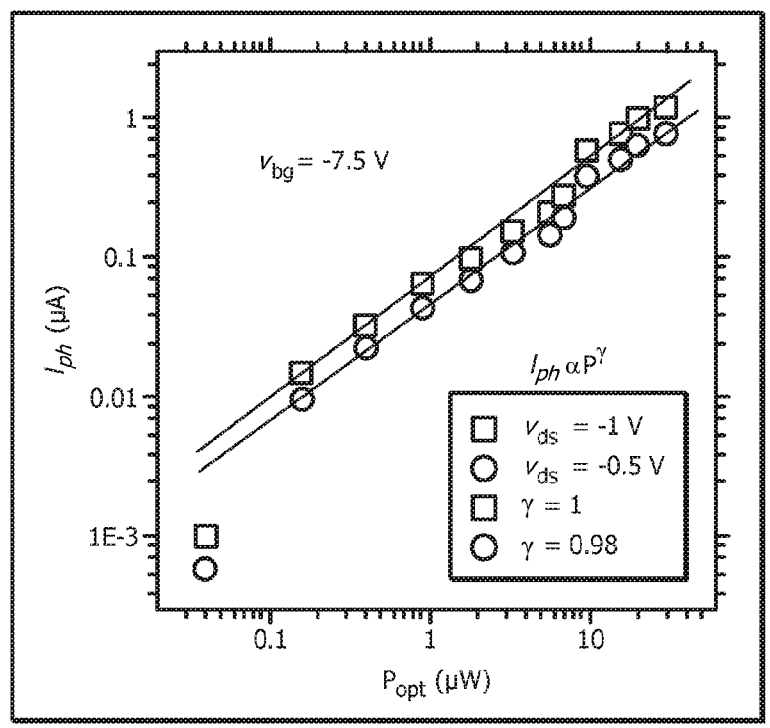
FIG. 7B is a graphical illustration of the same data as in FIG. 7A, but under $V_{bg}$=−7.5 V and for $V_{ds}$=−1 and −0.5 V. The solid lines are logarithmic fits.
Figure 7C:
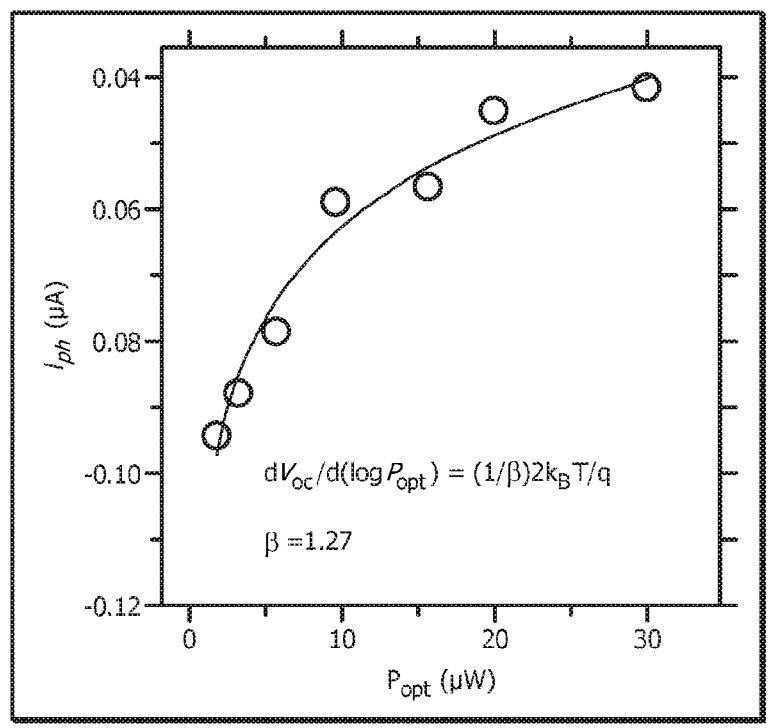
FIG. 7C is a graphical illustration of $V_{oc}$ as a function of $P_{opt}$, for $V_{bg}$=0 V and $V_{ds}$=−1.5 V, in accordance with a first exemplary FET embodiment of the present invention. The solid lines are logarithmic fits.
Figure 7D:
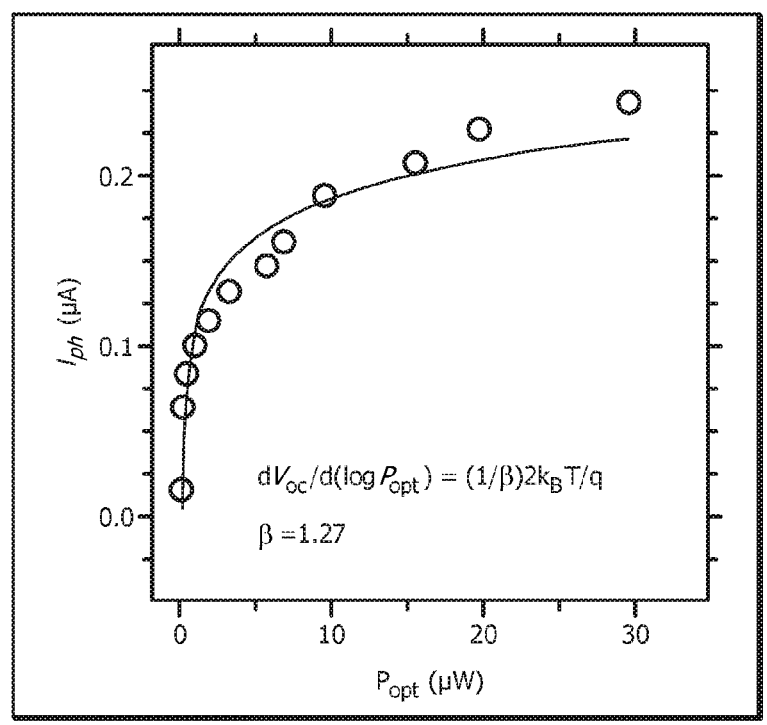
FIG. 7D is a graphical illustration of the open circuit voltage $V_{oc}$ as a function of $P_{opt}$, for $V_{bg}$=−7.5 V and $V_{ds}$=−0.5 V, in accordance with a first exemplary FET embodiment of the present invention. The solid lines are logarithmic fits.

In a second exemplary FET embodiment, FIG. 4A-FIG. 4C illustrates that a photovoltaic response can be extracted from a dual Schottky barrier established in the MoSe$_2$ FET of the present invention, in the absence of a gate voltage. In accordance with this second exemplary FET embodiment, FIG. 4A displays the I$_{ds}$ as a function of V$_{ds}$ characteristics for a second transistor under V$_{bg}$=0 V and for several values of the laser illumination power P. In contrast with the first exemplary FET, in the second exemplary FET, it can be see that the I-V characteristics are far more symmetric with respect to the sign of the bias voltage. As described in more detail below, the higher symmetry of the second exemplary FET is attributable to a smaller difference in the height of both Schottky barriers. FIG. 4B plots I$_{ds}$ as a function of V$_{ds}$, for the same data as in FIG. 4A, but in an amplified scale, where one can observe the short-circuit current, or the photogenerated current in the absence of a bias voltage, or the photovoltaic effect. In the same figure, one can extract the photogenerated voltage in the absence of any electrical current or the open-circuit voltage V$_{oc}$. FIG. 4C illustrates the concomitant elecrical power. FIG. 4C displays the concomitant electrical power P$_{el}$=I$_{ds}$×V$_{ds}$ within the quadrant spanning from I$_{ds}$=0 A to V$_{ds}$=0 V, which is attributable solely to the photovoltaic effect. As seen, in the absence of a gate voltage, one can extract very small electrical powers, on the order of 100 pW, implying very small power conversion efficiencies. The important point is that the collection of charge carriers through the contacts, and in the absence of a conventional p-n junction or of a bias voltage, is possible in the optical FET switch of the present invention, which is consistent with a gradient of chemical potential. This observation can be attributed to, for example, Fermi surface pinning by impurities around the contact area or asymmetric Schottky barriers, which would accelerate carriers towards the contacts. The response may also be attributed to an illumination induced thermal gradient between the channel and the contacts. With reference to FIG. 5A-5F, a detailed electrical characterization under illumination power illustrates that this second exemplary optical FET also displays a light-induced, gate voltage controllable rectification response. FIG. 5A-FIG. 5F illustrate the overall photo response from the second exemplary MoSe$_2$ FET under illumination by a λ=532 nm laser with a spot size of 3.5 µm. FIG. 5A illustrates the drain to source current I$_{ds}$ as a function of the bias voltage V$_{ds}$ for several values of the illumination power and under a gate voltage V$_{bg}$=+7.5V and FIG. 5B illustrates the same drain to source current, but under V$_{bg}$=−7.5V. FIG. 5C illustrates the same drain to source current as in FIG. 5A, but in an amplified scale and FIG. 5D illustrates the same drain to source current as in FIG. 5B, but in an amplified scale. By comparing FIG. 5C and FIG. 5D, is can be seen that under both gate voltages, one obtain relatively similar values for the short circuit currents I$_{sc}$=I$_{ds}$(V$_{ds}$=0 V). FIG. 5E illustrates the photogenerated electrical power P$_{el}$=I$_{ds}$×V$_{ds}$ as extracted from the fourth quadrant of FIG. 5C, spanning from V$_{ds}$=0V to I$_{ds}$=0 A, and FIG. 5F illustrates the photo-generated electrical power P$_{el}$=I$_{ds}$×V$_{ds}$ as extracted from the fourth quadrant of FIG. 5D, spanning from V$_{ds}$=0V to I$_{ds}$=0 A. It can be seen with reference to FIG. 5E and FIG. 5F that the second exemplary optical FET, in sharp comparison with the first exemplary optical FET, yields comparable P$_{el}$ values for both the positive and negative gate voltages, although this higher degree of symmetry leads to much lower photogenerated power values when compared to the ones extracted from the optical FET of the first exemplary embodiment under a negative gate voltage. Additionally, in the second exemplary optical FET, while inverting the sign of the gate voltage switches the sense of current rectification, as was also observed in the first exemplary optical FET, in this second embodiment, the sense of current rectification displays an opposite dependence on the sign of the gate voltage. For example, for the first exemplary FET, one extracts a sizeable I$_{ds}$ only when both V$_{ds}$ and V$_{bg}$ are either >0 or <0, which is in contrast with the response observed in the second exemplary FET. The difference in the observed response of the first exemplary FET compared to the second exemplary FET indicates that the gate voltage is modulating the amplitude of each Schottky barrier in an independent and non-trivial manner, for example by pinning the Fermi level at distinct impurity levels at each contact. It can be noted that for the second exemplary FET, under zero bias and for both positive and negative gate voltages, one extracts similar values for the short circuit current, suggesting that for this embodiment, the gate voltage can invert the asymmetry between both Schottky barriers. It also points toward a lower degree of asymmetry in the height of both barriers. As illustrated, a higher degree of symmetry leads to lower electrical power conversion levels, when compared to the first exemplary FET under V$_{bg}$=−7.5V FIG. 6A displays I$_{ds}$ as a function of V$_{ds}$, in accordance with the first exemplary optical FET embodiment, but under V$_{bg}$=+7.5V, and for several values of the illumination power, illustrating again that a photovoltaic response can be extracted from the optical FET of the present invention. FIG. 6B shows again the same data but in an amplified scale in order to expose both the short circuit current I$_{sc}$ and the open circuit voltage V$_{oc}$. FIG. 6C plots the corresponding photogenerated electrical power P$_{el}$. Notice how under V$_{bg}$=+7.5 V and for the same Ps, one ends up extracting lower P$_{el}$ values than was extracted for the second exemplary embodiment, under V$_{bg}$=0 V. In contrast, and as seen in FIG. 6D, one can obtain far more pronounced photocurrents under V$_{bg}$=−7.5 V (larger by more than one order of magnitude when compared to V$_{bg}$=+7.5 V) thus indicating a very pronounced asymmetry with respect to the sign of the gate voltage. The results of the numerical simulations requiring a higher asymmetry in the height of the Schottky barriers than the one resulting from the fittings to the data from the second exemplary embodiment (in FIG. 3A) are illustrated in FIG. 6D. Even more pronounced are the concomitant values for I$_{sc}$ and V$_{oc}$ as shown in FIG. 6E. As seen in FIG. 6F, and by comparing it to FIG. 6C, one ends up extracting far more pronounced P$_{el}$ values indicating that a higher asymmetry leads to a more pronounced photovoltaic response. With reference to FIG. 7A-FIG. 7D, plots of the photocurrent and of the open-circuit voltage as a function of the applied optical power are illustrated in accordance with the first exemplary optical FET. FIG. 7A illustrates the photocurrent I$_{ph}$ as a function of the applied optical power P$_{opt}$ in a log-log scale, for two values of the bias voltage V$_{ds}$=+1.5V and V$_{ds}$=−1.5V, and for zero gate voltage. FIG. 7B illustrates the same photocurrent as in FIG. 7A, but under V$_{bg}$=−7.5V and for V$_{ds}$=−1V and −0.5V. In both figures, the solid lines are representative of linear fits. FIG. 7C and FIG. 7D illustrate V$_{oc}$ as a function of P$_{opt}$ for V$_{bg}$=0V and V$_{ds}$=−1.5V, and for V$_{bg}$=−7.5V and V$_{ds}$=−0.5V, respectively. In FIG. 7C and FIG. 7D, the solid lines are logarithmic fits. FIG. 7A-FIG. 7D illustrate that both photocurrent I$_{ph}$=I$_{ds}$(P)−I$_{ds}$(P=0 W) and the extracted open circuit voltages V$_{oc}$ as functions of the applied laser power P$_{opt}$ for two values of the gate voltage V$_{bg}$ and for several values of the bias voltage. As illustrated, I$_{ph}$ displays a power dependence on P$_{opt}$ or I$_{ph}$∝P$^γ_{opt}$ with an exponent γ ranging from 1 to 0.7. The results shown in FIG. 7A-FIG. 7D suggest that the photothermoelectric effect might play a role in the observed photoresponse of the inventive MoSe$_2$ field-effect transistors. $V_{oc}$ on the other hand, displays the characteristic logarithmic dependence on $P_{opt}$ although the slope of the logarithmic fit yields β values closer to 1, according to $dV_{oc}/d(\log P_{out})=2k_BT/\beta e$ and suggests the predominance of monomolecular recombination processes over the bimolecular or Langevin one (which would yield β=2). Additionally, with reference to FIG. 8A-FIG. 8D, photoresponsivities and concomitant external quantum efficiencies for the first exemplary optical FET are illustrated. FIG. 8A illustrates the photoresponsivity $R=I_{ph}/P_{opt}$ as a function of $P_{opt}$ for three values of the bias voltage, 0.0 V, 1.0 V and 1.5 V. In FIG. 8A-FIG. 8D the solid lines are linear fits yielding nearly the same power law dependence $R \propto P^\gamma_{opt}$ with γ≅−0.3. FIG. 8B illustrates EQE (external quantum efficiencies) as extracted from the data in FIG. 8A, yielding the same power dependence. FIG. 8C illustrates photoresponsivity as a function of $P_{opt}$ under $V_{bg}$=−7.5V and for 3 values of the bias voltage, 0.0 V, 0.5 V and −1.0 V. The solid lines are linear fits yielding γ≅−0.15. FIG. 8D illustrates EQE from the data in FIG. 8C. In general, FIG. 8A-FIG. 8D illustrate both the photoresponsivity $R=I_{ph}/P_{opt}$ and the external quantum efficiency as $EQE=hcR/e\lambda$, where λ=532 nm for the first exemplary optical FET, under several values of the bias and gate voltages. As illustrated, the photoresponsivity approaches 100 mA/W at low $P_{opt}$ values under 0, as well as under an applied gate voltage. On the other hand, EQE approaches maximum values ranging between 20% and 30% at low $P_{opt}$ values.

FIG. 9A and FIG. 9B compare the response of the first exemplary embodiment of the optical FET to the response of second exemplary embodiment of the optical FET, the current-voltage characteristics for both embodiments are illustrated in FIG. 9A and FIG. 9B, respectively. FIG. 9A illustrates the I-V characteristics of the first exemplary FET embodiment under several back voltages and under dark conditions, revealing a pronounced non-linear I-V response, particularly at low excitation voltages. This non-ohmic behavior can be attributed to pronounced Schottky barriers between the MoSe2 channel and the Au:Ti contacts. In contrast, in the second exemplary FET embodiment, as illustrated in FIG. 9B, a linear response or ohmic-like response is observed at low bias voltages. The response of the second exemplary optical FET indicates that thermionic emission can promote charge carriers across the Schottky barriers at room temperature.

FIG. 10A-FIG. 10E illustrate a third exemplary embodiment of an optical FET switch in accordance with the present invention. The third exemplary embodiment is a tri-layered optical FET switch, illustrating that the rectification effect is also observed in thinner samples, characterized by a larger, and nearly direct, semiconducting gap. FIG. 10A illustrates an atomic force microscopy height profile of the third exemplary FET, indicating a thickness of approximately 2 nm, which is equivalent to 3 atomic layers. FIG. 10B is a micrograph of the third exemplary FET. FIG. 10C illustrates the drain to source current $I_{ds}$ as a function of the bias voltage $V_{ds}$ for two values of the gate voltage, +15V and −15V, under an illumination power of P=30 μW. FIG. 10D illustrates the drain to source current as a function of the bias voltage for several values of illumination power, wherein it is shown that the photogenerated current is finite in the absence of a bias voltage (photovoltaic effect). FIG. 10E illustrates the photogenerated electrical power $P_{el}=I_{ds} \times V_{ds}$ as a function of $V_{ds}$ for several values of the illumination power. As shown in FIG. 10E, the maximum photogenerated electrical power and more generally, the response of the third exemplary FET is a few orders of magnitude smaller than that extracted from both the first exemplary FET and the second exemplary FET, which are thicker crystals. As such, while the third exemplary FET is thinner than the first exemplary embodiment and the second exemplary embodiment, it has been shown that the thinner third exemplary FET also supports the inventive concept in which Schottky barriers in both electrodes act as two Schottky diodes, which leads to the observed PV response in the absence of a fabricated p-n junction.

With reference to FIG. 11A-FIG. 11D, in accordance with the optical FET switch of the present invention, a field-effect transistor that is controlled by the Schottky barriers between the Ti:Au metallic contacts and the MoSe$_2$ layers is illustrated, wherein the FET switch can be modeled as two Schottky diodes with opposite sense of current rectification. FIG. 11A depicts a diagrammatic view of a multi-layered MoSe$_2$ field-effect transistor 400 contacted which Ti:Au under laser illumination 440 and an applied back gate voltage 450. As shown in FIG. 11A, an optical FET 400 in accordance with an embodiment of the present invention includes, a p-doped semiconductor substrate 405, an SiO$_2$ layer 410, approximately 300 nm thick, positioned over the semiconductor substrate 405, a transition metal dichalcogenides (TMD) layer positioned 415 over the oxide layer 410, a first contact 420 and a second contact 425 positioned on the oxide layer 410 and separated by the TMD layer 415. The gate voltage 450 spatially separates photogenerated electrons and holes toward the bottom and the top layer, which leads to an increase in the electron-hole recombination times. The sense of rectification is simply defined by the geometry of the sample with the Au contacts 420, 425 located to the right and to the left of the MoSe$_2$ channel 415 at the source and drain contacts, respectively. The presence of states at the metal/MoSe$_2$ interface, such as dangling bonds, impurities, and residues of the lithographic process, pin the Fermi level somewhere in the middle of the semiconducting gap. With reference to FIG. 11B, both Schottky barriers (and concomitant Schottky diodes), one being at the source 455 and one at the drain 460, would not be identical and, in general, they would be expected to have some small difference Δ 465 between the respective barrier heights 455, 460. Slight differences in contact geometry can also affect their resistance. However, the application of a gate voltage modulates or reduces the size of both barriers, as in FIG. 11B, wherein $E_v$ and $E_c$ which stand for valence 500 and conduction bands 505, respectively while $E_F$ stands for the Fermi level 510. As discussed and illustrated, simulations and concomitant fits indicate that $V_{bg}$ can affect/reduce the height of each barrier by different fractions. As illustrated in FIG. 11C and FIG. 11D, the simultaneous application of light, which separates/generates electrons and holes, and a bias voltage 515, which tilts the valence and the conduction bands 500, 505, allows one to harvest either type of charge carrier. Their curvature in the neighborhood of the contacts as well as their position with respect to $E_F$ 510 is controlled by $V_{bg}$ 515. The type of charge carrier to be harvested depends on the sign of the gate voltage 515, which displaces the Fermi level 510 toward either the conduction 500 or the valence band 505. The sense of current rectification, on the other hand, depends upon the relative size difference 465 between both Schottky barriers 455, 460, as defined by $V_{bg}$.

In a circuit model of the optical FET switch 600 of the present invention, the two Schottky diodes 605, 610 are in series and have opposing orientation for their forward biases, as schematically shown in the FIG. 12A, which illustrates an equivalent circuit 600 which is believed to capture the observed behavior in accordance with an embodiment of the present invention. Each contact is characterized by a Schottky diode whose rectification current flows in the opposite sense with respect to one another. Identical diodes would lead to no net photocurrent under illumination. But the application of a gate voltage modulates the relative amplitude between both barriers, allowing the photo generated current 615, 620 to flow through either contact depending on the sign of the gate voltage. The resistor $R_s$ 625 represents a shunt resistance such as the resistance of the channel. Furthermore, under illumination the diodes 605, 610 produce photo-generated currents flowing in opposite directions as is discussed below. Representation of a single Schottky diode by means of a Schottky diode current and a photo-generated current flowing in the opposite direction as illustrated in FIG. 12A is considered standard. However, in the case of the optical FET switches of the present invention, the optical FET switches provide a dual Schottky diode photovoltaic response. The circuit that captures the essential aspects of the device is illustrated with reference to FIG. 12A.

In a particular embodiment, two Schottky diodes connected in series have been used to represent the two opposite rectification Schottky diodes formed at the metal-semiconductor (source) and semiconductor-metal (drain) contacts of the optical FET switch. The resistor $R_S$ represents the intrinsic resistance of the device. The standard approach of using the Shockley diode equation to approximate each Schottky diode has been used. The Kirchhoff-Shockley equations of this circuit are the following:

$$I_{ds}=I_L^{(s)}-I_D^{(s)}=I_D^{(d)}-I_L^{(d)},$$

$$V_{ds}=V_{AB}+V_{BC}+I_{ds}R_S,$$

$$I_D^{(s)} = I_0^{(s)}\left(\exp\left(\frac{V_{BA}}{n_s k_B T}\right)-1\right),$$

$$I_D^{(d)} = I_0^{(d)}\left(\exp\left(\frac{V_{BC}}{n_d k_B T}\right)-1\right),$$

where, $I_D^{(s,d)}$ is the source and drain diode currents and $I_L^{(s,d)}$ the photo-generated currents; $n_s$ and $n_d$ are the ideality factors of each of the two Schottky diodes. For given values of the parameters $I_0^{(s,d)}$, $I_L^{(s,d)}$, $R_S$ and $n_s$, $n_d$, the above sets of equations can be solved self-consistently (using the Newton-Raphson technique) to obtain the $I_{ds}$ versus $V_{ds}$ characteristics. Typical solutions of the above equations are illustrated by the fitting of the numerical results shown in FIG. 12B and FIG. 12C. The results fit reasonably well with the experimental data by using ideality factors $n_s$ and $n_d$ close to unity. The only difference in the extracted parameters obtained by fitting the I-V characteristics under various illumination powers P, including P=0 W, for any given sample are in the values of the photocurrent parameters $I_L^{(s)}$ and $I_L^{(d)}$. The other parameters remain independent of P, which indicates that the physics of the device is correctly captured by the above simple model. Furthermore, the values of $I_L^{(s)}$ and $I_L^{(d)}$ scale roughly linearly in P. It is found that that the values of $I_L^{(s)}$ and $I_L^{(d)}$ are strongly dependent on the asymmetry of the Schottky barriers which is marked sample dependent. For example, the response of the first exemplary FET switch, illustrated in FIG. 12C is far more asymmetric than the response of the second exemplary FET switch, illustrated in FIG. 12B. FIG. 12B illustrates fits of experimental data from the second exemplary FET under $V_{bg}$=0 V and two values of the illumination power, $P_{out}$=15.7 µW and $P_{out}$=30 µW, to the dual Schottky circuit model in FIG. 12A. FIG. 12C illustrated fits of experimental data from the first exemplary FET under $V_{bg}$=−7.5 V and two values of the illumination power, $P_{out}$=15.7 µW and $P_{out}$=30 µW, to the dual Schottky circuit model in FIG. 12A.

The tables shown in FIGS. 13A and 13B present the values of the parameters $n_s$, $n_d$, $R_S$, $I_L^{(s)}$, $I_L^{D}$, $I_0^{(s)}$, and $I_0^{D}$ of the Kirchoff-Shockley circuit and which are used to describe the fit to the experimental data. The table of FIG. 13A shows the value of the parameters for the first exemplary FET obtained by fitting the experimental results under various conditions. The table of FIG. 13B shows the value of the parameters for the second exemplary FET obtained by fitting the experimental results under various conditions. Notice that by illuminating the devices, the only two parameters that are allowed to change are the photocurrent parameters $I_L^{(s)}$, $I_L^{(d)}$, and the rest of the parameters remain the same, as for the device in dark current. Also, notice that one of the main effects of the back gate voltage is to significantly alter the values of the Shockley parameters $I_0^{(s)}$, and $I_0^{(d)}$ where the role of the Schottky barrier is "hiding". These changes also cause the distribution of the photocurrent in terms of $I_L^{(s)}$, and $I_L^{(d)}$ to change.

In the present inventive optical FET switches, the application of a back gate voltage can alter the relative size of both Schottky barriers, i.e. they are not necessarily displaced in energy by the exact same amount. For photovoltaic applications, it is observed that the size of the short circuit current $I_{sc}$ can be modulated by altering the relative size between both Schottky barriers with the back-gate voltage. For example, for in the first exemplary embodiment, the relative size of the Schottky barriers favored current rectification along one specific sense. However, by inverting the gate voltage it is possible to alter their relative size and allow current rectification in the opposite sense. In addition, by increasing the carrier recombination times due to the vertical separation of carriers by the gate voltage, one can considerably increase the short circuit current. Accordingly, in the optical FET devices of the present invention, a very pronounced asymmetry leads to just one sense of current rectification, although such a pronounced asymmetry is likely to produce a sizeable photovoltaic response in the absence of doping or of a more complex architecture, such as a p-n junction. Such a result is illustrated by the overall photovoltaic evaluation presented in FIG. 14A-FIG. 14F.

FIG. 14A-FIG. 14C illustrate data related to the second exemplary optical FET and FIG. 14D-FIG. 14F illustrate data related to the first exemplary optical FET. FIG. 14A illustrates short-circuit current $I_{sc}$=$I_{ds}$($V_{ds}$=0V) and open-circuit voltage $V_{oc}$=$V_{ds}$($I_{ds}$=0 A) as functions of the applied illumination power density $p_{opt}$ for the second exemplary optical FET under zero gate voltage. FIG. 14B illustrates fill factor FF=$P_{el}^{max}$/($I_{sc} \times V_{oc}$) as a function of $p_{opt}$, for the second exemplary optical FET. FIG. 14C illustrates photovoltaic efficiency η defined here as $P_{el}^{max}$/$P_{opt}$, wherein $P_{opt}$ is total illumination power, as a function of $p_{opt}$ under $V_{bg}$=0V, for the second exemplary optical FET. One extracts η values in the order of just $1\times10^{-2}$% at low $p_{opt}$, suggesting a mild gradient of chemical potential which separates electron-hole pairs and allows their collection at the contacts before recombination. FIG. 14D illustrates short-circuit current $I_{sc}=I_{ds}(V_{ds}=0V)$ and open-circuit voltage $V_{oc}=V_{ds}$ ($I_{ds}=0$ A) as functions of the applied illumination power density $p_{opt}$ for the first exemplary FET, under $V_{bg}=-7.5$ V. The solid line corresponds to a linear fit of $V_{oc}$ in a semi-log scale, indicating that $V_{oc}$ displays a logarithmic dependence on $p_{opt}$. A linear fit of $\log(I_{sc})$ as a function of $\log(p_{opt})$ yields an exponent $\alpha=1.06$. FIG. 14E illustrates fill factor $FF=P_{el}^{max}/(I_{sc}\times V_{oc})$ as a function of $p_{opt}$, for the first exemplary optical FET, under $V_{bg}=-7.5$ V. It can be seen when comparing FIG. 14E and FIG. 14B, that larger FF values are extracted from the first exemplary FET, particularly at low $p_{opt}$. FIG. 14F illustrates photovoltaic efficiency η defined here as $P_{el}^{max}/P_{opt}$, wherein $P_{opt}$ is total illumination power, as a function of $p_{opt}$ under $V_{bg}=-7.5$ V, for the first exemplary optical FET. FIG. 14F indicates that one would extract photovoltaic efficiencies approaching 0.05% at low power densities for the first exemplary FET as compared to the second exemplary FET, which only yields photovoltaic efficiencies approaching 0.01%.

The optical FET switches of the present invention, comprising a multi-layered $MoSe_2$ field-effect transistors electrically contacted with Ti:Au, provides a light-induced diode-like response. The illustrated numerical simulations indicate that this behavior results from an asymmetry in the size of the Schottky barriers between drain and source contacts with each barrier being described as a Schottky diode, but with opposite senses of current rectification. This diode-like response would result from the light induced promotion of photo-generated carriers across the smaller of the two barriers. In the optical FETs of the present invention, the sense of current rectification can be effectively controlled by the back-gate voltage through its ability to modulate the relative amplitude between both barriers. This diode response yields a sizeable photovoltaic response in absence of a PN-junction such as those created by either electrostatic or chemical doping opening up the possibility of fabricating simpler and cost effective solar cells based on transition metal dichalcogenides. By precisely controlling the size of the Schottky barriers between the transition metal dichalcogenides and the metallic contacts, it is possible to fabricate field-effect transistors displaying a more pronounced diode like response upon illumination. Their asymmetry in height already leads to sizeable photovoltaic power conversion efficiencies although these might increase by just increasing this relative asymmetry.

The present invention describes a transition metal dichalcogenides based field-effect transistor that can be used as new type of photo-switches displaying a diode like response triggered by light, but whose sense of current rectification is controlled by a gate voltage. As such, the present invention describes a new type of electro-optic effect which, in its usual connotation, refers to the change in the optical properties of any given material upon the application of a slowly varying electric field. The inventive FET devices can be used in logical inverters and logical NOR operations in dual gated field-effect transistors and in optically activated diodes to produce logical operations. Accordingly, logical operations could be performed by controlling the respective senses of current rectification of the optical FETs with gate voltages, while having the ability to activate the logical elements with an optical signal.

In an exemplary embodiment, $MoSe_2$ single-crystals were synthesized through a chemical vapor transport technique using iodine as the transport agent. Multi-layered flakes of $MoSe_2$ were exfoliated from these single-crystals by using the micromechanical exfoliation technique, and transferred onto p-doped Si wafers covered with a 270 nm thick layer of $SiO_2$. For making the electrical contacts 90 nm of Au was deposited onto a 4 nm layer of Ti via e-beam evaporation. Contacts were patterned using standard e-beam lithography techniques. After gold deposition, these devices were annealed at 250° C. for ~2 h in forming gas. This was followed by a subsequent high vacuum annealing for 24 h at 120° C. Atomic force microscopy (AFM) imaging was performed using the Asylum Research MFP-3D AFM. Electrical characterization was performed by using Keithley 2612 A sourcemeter. Measurements as a function of the temperature were performed in a Physical Property Measurement System. The sample was kept under a low pressure of $^4$He as exchange gas. Energy dispersive spectroscopy, to verify the stoichiometry, was performed through field-emission scanning electron microscopy (Zeiss 1540 XB). For photo-current measurements a Coherent Sapphire 532-150 CW CDRH and Thorlabs DLS146-101S were used, with a continuous wavelength of 532 nm. Light was transmitted to the sample through a 3 µm single-mode optical-fiber with a mode field diameter of 3.5 µm. The size of the laser spot was also measured against a fine grid. Hence, here is used 3.5 µm for the laser spot diameter assuming a constant power density distribution in order to approximate the Gaussian distribution corresponding to the mode field diameter of 3.5 µm. Particular care was taken to avoid illumination of the electrical contacts, although it is likely that some scattered or reflected light illuminated the area contiguous to the contacts. For the dark current measurements, the device under test was covered with a black box (with controlled access for the laser beam) to prevent any exposure to light.

The method of manufacturing the optical FET described above is merely exemplary in nature and many other methods are within the scope of the invention, such as those methods commonly know in the art for manufacturing field-effect transistors.

It will be seen that the advantages set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. An optical FET (field-effect transistor) switch comprising:
   a semiconductor substrate;
   a dielectric layer positioned over the semiconductor substrate;
   a transition metal dichalcogenides (TMD) layer positioned over the dielectric layer;
   a first contact and a second contact positioned on the TMD layer;
   a first Schottky diode formed at an interface between the first contact and the TMD layer; and
   a second Schottky diode formed at an interface between the second contact and the TMD layer, wherein a barrier height of the first Schottky diode and a barrier height of the second Schottky diode are asymmetrical and wherein a sense of current rectification of the first Schottky diode is opposite a sense of current rectification of the second Schottky diode.

2. The optical FET switch of claim 1, wherein the semiconductor substrate is a p-doped silicon (Si) wafer.

3. The optical FET switch of claim 1, wherein the oxide layer is a silicon dioxide ($SiO_2$) layer.

4. The optical FET switch of claim 1, wherein the TMD layer is a molybdenum ($MOSe_2$) layer comprising multi-layered flakes of $MOSe_2$.

5. The optical FET switch of claim 1, wherein the first contact comprises at least one metal having a first work function and the second contact comprises at least one metal having a second work function.

6. The optical FET switch of claim 1, wherein the first contact and the second contact are comprised of at least one metal and the at least one metal of the first contact is different than the at least one metal of the second contact.

7. The optical FET switch of claim 1, wherein the first contact and the second contact are comprised of at least one metal and the at least one metal of the first contact is different than the at least one metal of the second contact and wherein a first work function of the first contact is different than a second work function of the second contact.

8. The optical FET switch of claim 1, wherein the first contact and the second contact are metal contacts comprising the same metal or combination of metals and wherein a first work function of the first contact is different than a second work function of the second contact.

9. The optical FET switch of claim 1, wherein the first contact and the second contact comprise a layer of gold (Au) and a layer of titanium (Ti).

10. The optical FET switch of claim 1, wherein the first contact comprises palladium (Pd) and the second contact comprises scandium (Sc).

11. The optical FET switch of claim 1, further comprising a gate voltage coupled to the semiconductor substrate, the gate voltage to control the barrier height of the first Schottky diode relative to the barrier height of the second Schottky diode, thereby controlling the sense of current direction in the first Schottky diode and the sense of current direction in the second Schottky diode.

12. An optical FET (field-effect transistor) switch comprising:
   a semiconductor substrate;
   a dielectric layer positioned over the semiconductor substrate;
   a transition metal dichalcogenides (TMD) layer positioned over the dielectric layer;
   a first contact and a second contact positioned on the TMD layer, wherein the first contact comprises at least one metal having a first work function and the second contact comprises at least one metal having a second work function and wherein the first work function is different than the second work function;
   a first Schottky diode formed at an interface between the first contact and the TMD layer; and
   a second Schottky diode formed at an interface between the second contact and the TMD layer, wherein a barrier height of the first Schottky diode and a barrier height of the second Schottky diode are asymmetrical and wherein a sense of current rectification of the first Schottky diode is opposite a sense of current rectification of the second Schottky diode.

13. A method for generating a photovoltaic response in a multi-layered transition metal dichalcogenides (TMD) field-effect transistor (FET) comprising:
   establishing a first Schottky diode at an interface between a first contact and a transition metal dichalcogenides (TMD) layer of a transition metal dichalcogenides (TMD) field-effect transistor (FET); and
   establishing a second Schottky diode at an interface between a second contact and the TMD layer of the transition metal dichalcogenides (TMD) field-effect transistor (FET), wherein a barrier height of the first Schottky diode and a barrier height of the second Schottky diode are asymmetrical and wherein a sense of current rectification of the first Schottky diode is opposite a sense of current rectification of the second Schottky diode; and subjecting the transition metal dichalcogenides (TMD) layer of the TMD field-effect transistor (FET) to illumination to generate a diode like response with concomitant photovoltaic effect in the TMD field-effect transistor (FET).

14. The method of claim 13, further comprising applying a gate voltage at a semiconductor substrate of the TMD field-effect transistor (FET) to control the barrier height of the first Schottky diode relative to the barrier height of the second Schottky diode, thereby controlling the sense of current rectification in the first Schottky diode and the sense of current rectification in the second Schottky diode.

15. The method of claim 13, wherein the TMD layer comprises a plurality of layers of transition metal dichalcogenides.

16. The method of claim 13, wherein the TMD layer is a molybdenum ($MOSe_2$) layer comprising multi-layered flakes of $MOSe_2$.

17. The method of claim 13, wherein the first contact comprises at least one metal having a first work function and the second contact comprises at least one metal having a second work function and wherein the first work function is different than the second work function.

18. The method of claim 13, wherein the first contact and the second contact are comprised of at least one metal and the at least one metal of the first contact is different than the at least one metal of the second contact.

19. The method of claim 13, wherein the first contact and the second contact are metal contacts comprising the same metal or combination of metals.

20. The method of claim 13, wherein the first contact and the second contact comprises a layer of gold (Au) and a layer of titanium (Ti).

* * * * *